US006967842B2

(12) United States Patent
Aoki et al.

(10) Patent No.: US 6,967,842 B2
(45) Date of Patent: Nov. 22, 2005

(54) ELECTRONIC DEVICE

(75) Inventors: Hitoshi Aoki, Saitama (JP); Junichi Kubota, Gunma (JP); Takeo Komatsubara, Gunma (JP); Junichi Motegi, Saitama (JP); Hirotaka Kakinuma, Gunma (JP); Naoki Otsuka, Gunma (JP); Masaya Matsuoka, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 78 days.

(21) Appl. No.: 10/651,606

(22) Filed: Aug. 29, 2003

(65) Prior Publication Data

US 2004/0250992 A1 Dec. 16, 2004

Related U.S. Application Data

(63) Continuation of application No. PCT/JP02/01597, filed on Feb. 22, 2002.

(30) Foreign Application Priority Data

| Mar. 2, 2001 | (JP) | 2001-058832 |
| Mar. 5, 2001 | (JP) | 2001-059679 |
| Mar. 5, 2001 | (JP) | 2001-060983 |

(51) Int. Cl.$^7$ .............................................. H05K 7/20
(52) U.S. Cl. ................. 361/701; 165/80.4; 165/104.33; 165/104.22; 361/699; 361/702; 361/710
(58) Field of Search ................... 165/80.4, 104.22, 165/104.33, 104.35; 174/15.1, 16.1; 361/687–711

(56) References Cited

U.S. PATENT DOCUMENTS

| 4,698,728 | A | * | 10/1987 | Tustaniwskyj et al. | ...... 361/699 |
| 5,144,531 | A | * | 9/1992 | Go et al. | ...... 361/702 |
| 5,323,847 | A | | 6/1994 | Koizumi et al. | |
| 5,646,824 | A | * | 7/1997 | Ohashi et al. | ...... 361/699 |
| 6,166,907 | A | * | 12/2000 | Chien | ...... 361/699 |

FOREIGN PATENT DOCUMENTS

| EP | 0 800 890 A1 | 10/1997 |
| EP | 0 985 999 A1 | 3/2000 |
| JP | 61-260660 A1 | 11/1986 |
| JP | 63-195748 | 12/1988 |
| JP | 3-208365 A1 | 9/1991 |
| JP | 3-120091 | 12/1991 |
| JP | 5-75284 A1 | 3/1993 |

(Continued)

Primary Examiner—Gregory Thompson
(74) Attorney, Agent, or Firm—Darby & Darby

(57) ABSTRACT

An electronic device capable of efficiently cooling an integrated circuit element provided in such a way as to enable a heat exchange on a cold plate. The electronic device contains a circuit board mounted with an integrated circuit element requiring measures against heat generation in a single case, comprising: a cold plate mounted on the integrated circuit element in such a way as to enable a heat transfer from the integrated circuit element; a heat exchanger for cooling brine heated by the cold plate by circulating the brine; a fan casing forming an air way from a blower fan at an opening on a surface of the case to the heat exchanger; a reserve tank and a pump provided in order in a brine flow from the heat exchanger to the cold plate; and a linear brine passage formed in the cold plate and having at least one pair of back and forth channels.

25 Claims, 21 Drawing Sheets

FOREIGN PATENT DOCUMENTS

| | | |
|---|---|---|
| JP | 5-264139 A1 | 10/1993 |
| JP | 6-3917 A1 | 1/1994 |
| JP | 2536063 B2 | 7/1996 |
| JP | 9-19728 A1 | 1/1997 |
| JP | 2778655 B2 | 5/1998 |
| JP | 2814331 B2 | 8/1998 |
| JP | 3060530 | 6/1999 |
| JP | 11-346079 A1 | 12/1999 |

* cited by examiner

ELECTRONIC DEVICE

This application is a Continuation of International Patent Application Ser. No. PCT/JP02/01597, filed Feb. 22, 2002, which published in Japanese on Sep. 19, 2002 as WO 02/074032 A1.

BACKGROUND OF THE INVENTION

1. Field of the Invention

The present invention relates to an electronic device containing a circuit board mounted with an integrated circuit element such as a CPU or an LSI requiring measures against heat generation in a single case.

2. Related Background Art

In recent years, there is a trend toward a heavy use of an element provided with numerous semiconductors or a semiconductor integrated circuit element such as a CPU or an LSI having a microelectronic circuit whose internal wires are connected as a single solid in a special method. The integrated circuit element having the microelectronic circuit generates a large amount of heat in a process of operation. A temperature rise of the integrated circuit element may cause a defect such that the operation of the integrated circuit element becomes unstable. A further temperature rise may destroy the semiconductor. Therefore, conventionally a heat sink has been mounted on the integrated circuit element for a heat exchange between the heat sink and an air to cool the integrated circuit element by releasing heat of the integrated circuit element to the air, thereby preventing the integrated circuit element such as a CPU or an LSI from getting unstable in its operation due to the high temperature or from being destroyed by heat.

On the other hand, a server is provided with numerous electronic devices using the integrated circuit element as set forth in the above for use in a data communication network with communication lines or a computer network (LAN) for a high-speed data transfer with privately owned lines within a limited range such as a building or a premise. In other words, a significant temperature rise occurs due to the operation of numerous integrated circuit elements in a server of the kind described above. Therefore, conventionally there has been applied a method of cooling an entire room where the server is installed with a cooling unit and taking the cold air into the electronic devices to cool the integrated circuit elements.

In the conventional method, however, in which the cold air is taken with a propeller fan (air blower) provided at the rear of the electronic device and the cold air generated within the electronic device is blown against the integrated circuit element, the cold air is applied to only a part of the integrated circuit element inefficiently in cooling.

Therefore, a part of the cold air taken into a case with the air blower has been ejected to an outside of the electronic device without cooling the integrated circuit element.

SUMMARY OF THE INVENTION

The present invention has been provided to resolve the above conventional problem. It is an object of the present invention to provide an electronic device capable of efficiently cooling an integrated circuit element provided in such a way as to enable a heat exchange on a cold plate.

In accordance with a first aspect of the present invention, there is provided an electronic device containing a circuit board mounted with an integrated circuit element requiring measures against heat generation in a single case, comprising: a cold plate mounted on the integrated circuit element in such a way as to enable a heat transfer from the integrated circuit element; a heat exchanger for cooling brine heated by the cold plate by circulating the brine; a fan casing forming an air way from a blower fan at an opening on a surface of the case to the heat exchanger; a reserve tank for storing the brine and a pump for circulating the brine, which are provided in order in a brine flow from the heat exchanger to the cold plate; and a linear brine passage formed in the cold plate and having at least one pair of back and forth channels.

With these features, the electronic device has a control unit for controlling at least one of the blower fan and the pump in such a way as to maintain a temperature of the cold plate at +70° C. or lower when a temperature of a periphery of the case is at +35° C. or higher.

Furthermore, with the above features, a plurality of the integrated circuit elements are mounted on the circuit board and the cold plate is provided for each of the integrated circuit elements.

Still further, with the above features, heat conductive material is provided between the integrated circuit element and the cold plate, and the integrated circuit element is put between the cold plate and a socket holding the integrated circuit element by using elastic material.

In addition, with the above features, the blower fan is a cross flow fan, which is provided in the vicinity of the opening of the case and supplies an air taken from the opening linearly along a long side of the heat exchanger.

With the above features, the fan casing is configured in such a way as to take in an air from below with its opening facing downward.

Furthermore, with the above features, the blower fan is a cross flow fan, which is provided in the vicinity of the opening of the case and discharges an air heated by the heat exchanger from the opening.

Still further, with the above features, the fan casing is configured in such a way as to discharge an air to above with its opening facing upward.

Additionally, with the above features, an angle of the opening of the fan casing is adjustable.

With the above features, the cold plate comprises two pieces of heat conductive material laminated to each other with a concavity and a convexity formed thereon engaged with each other so as to sandwich a pipe through which the brine flows between them.

Furthermore, with the above features, there is heat conductance between the heat conductive material and the pipe and sheet material having elasticity is sandwiched therebetween.

Still further, with the above features, bottlenecks are provided in positions corresponding to the upstream of the brine flow within the pipe put between two pieces of the heat conductive material.

With the above features, the heat exchanger comprises a plurality of plates having heat conductance and a pipe through which the brine flows with penetrating the plates in such a way as to enable a heat transfer, wherein a part of a casing covering the heat exchanger is formed by the fan casing or an extension thereof, and wherein the fan casing has a shape causing the air to be collected on the plates of the heat exchanger.

Furthermore, with the above features, a plurality of vent holes are provided in the position opposed to the circuit board on a surface of the case enclosing the circuit board.

Still further, with the above features, the vent holes are formed by cutting and raising a part of the case.

With the above features, a line forming a circulation path of the brine circulating between the cold plate and the heat exchanger is arranged in one side portion within the case and a bottom face of the side portion is formed lower than the heat exchanger.

With the above features, the reserve tank and the pump are arranged in the side portion within the case.

With the above features, the bottom face of the side portion within the case slopes downwardly in a predetermined direction.

Furthermore, with the above features, a brine detection sensor is provided in the lowest position of the bottom face within the case or in the vicinity thereof and a detection unit is provided for outputting an alarm in response to an output from the brine detection sensor.

Still further, with the above features, a plurality of cooling fins are provided in the side opposed to the integrated circuit element on the cold plate.

With the above features, an air blower for the cold plate is mounted on the cooling fins.

With the above features, the air blower for the cold plate has a centrifugal fan.

Furthermore, with the above features, the heat exchanger comprises a plurality of plates having heat conductance and a pipe through which the brine flows with penetrating the plates in such a way as to enable a heat transfer, wherein an outlet from the heat exchanger for the brine flowing from the pipe to the cold plate is provided in a position higher than the cold plate.

DETAILED DESCRIPTION OF THE PREFERRED EMBODIMENTS

Figure 1:
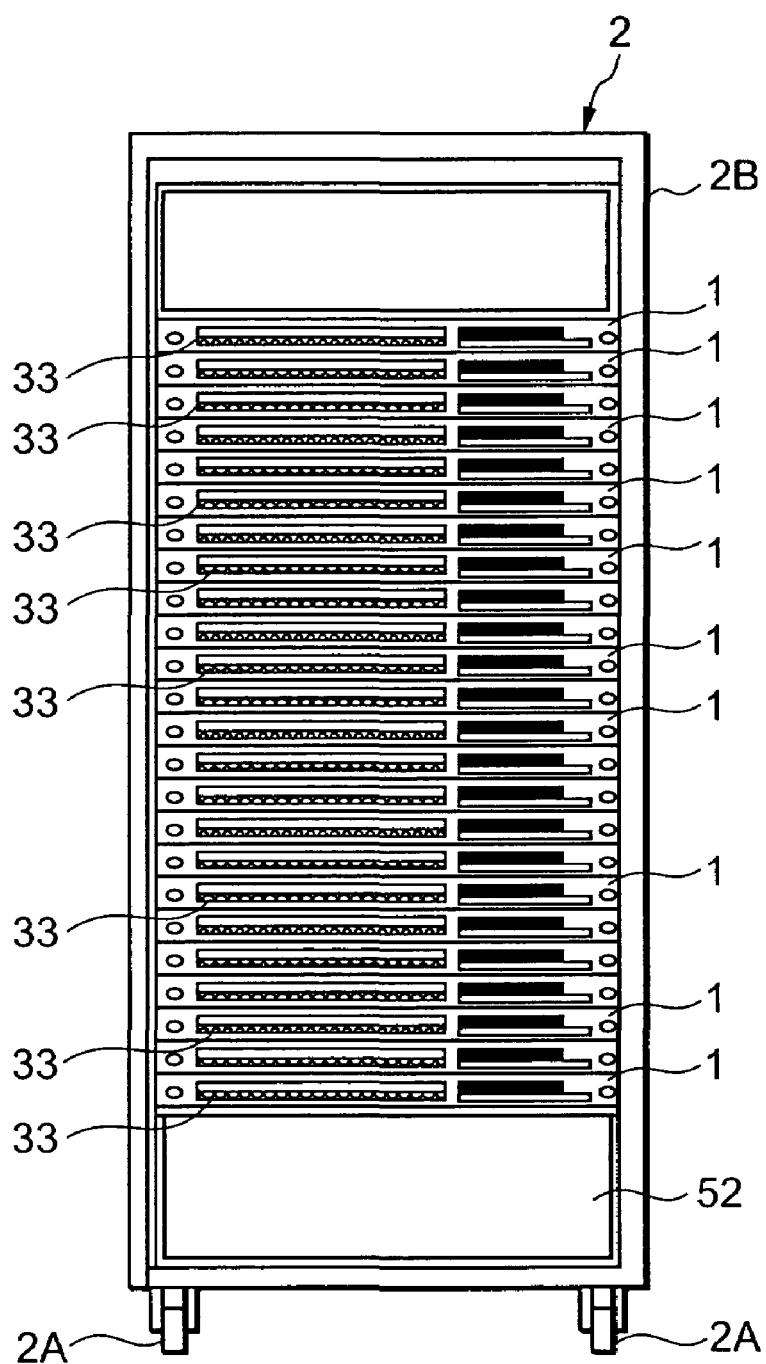
FIG. 1 is a front view of a server rack containing stacked servers, each of which is an embodiment of an electronic device according to the present invention.
Figure 2:
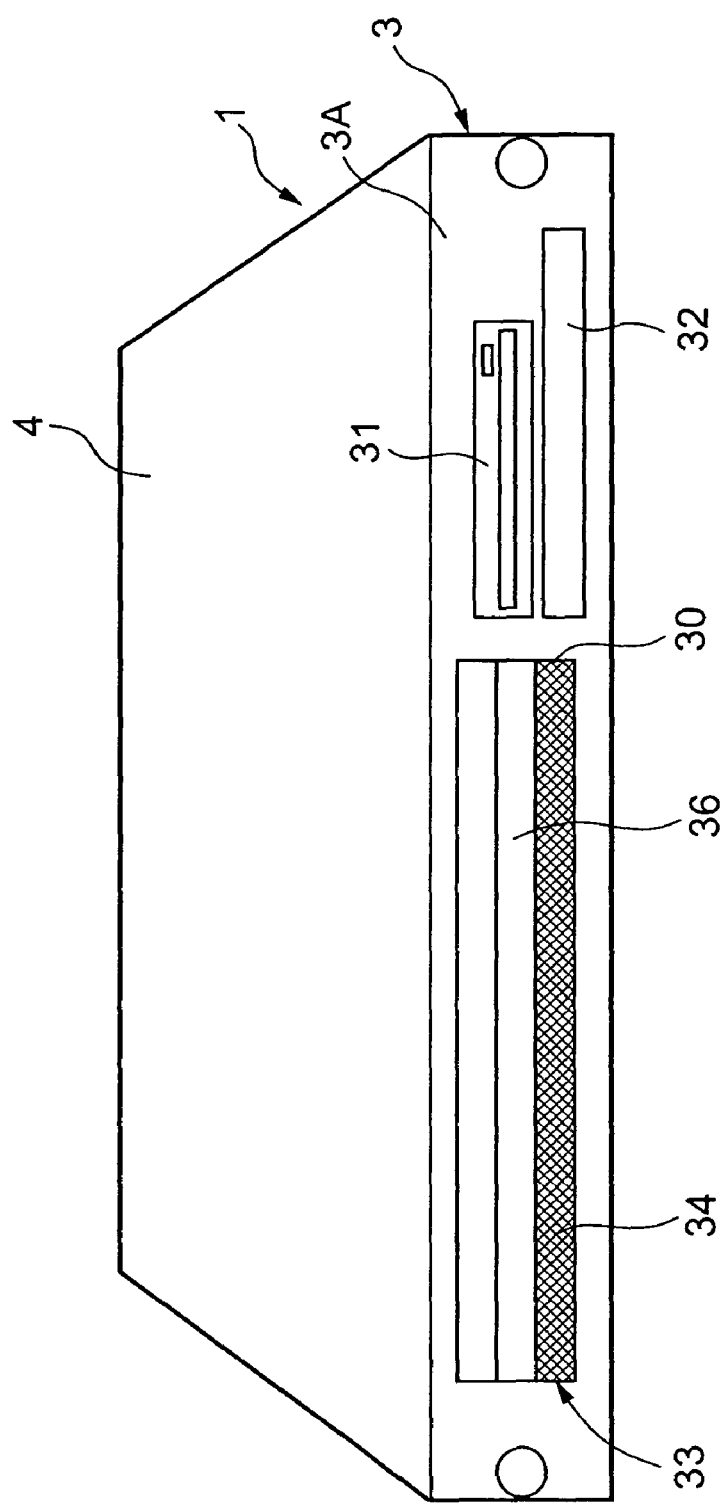
FIG. 2 is a perspective view of the server as an embodiment of the electronic device according to the present invention.
Figure 3:
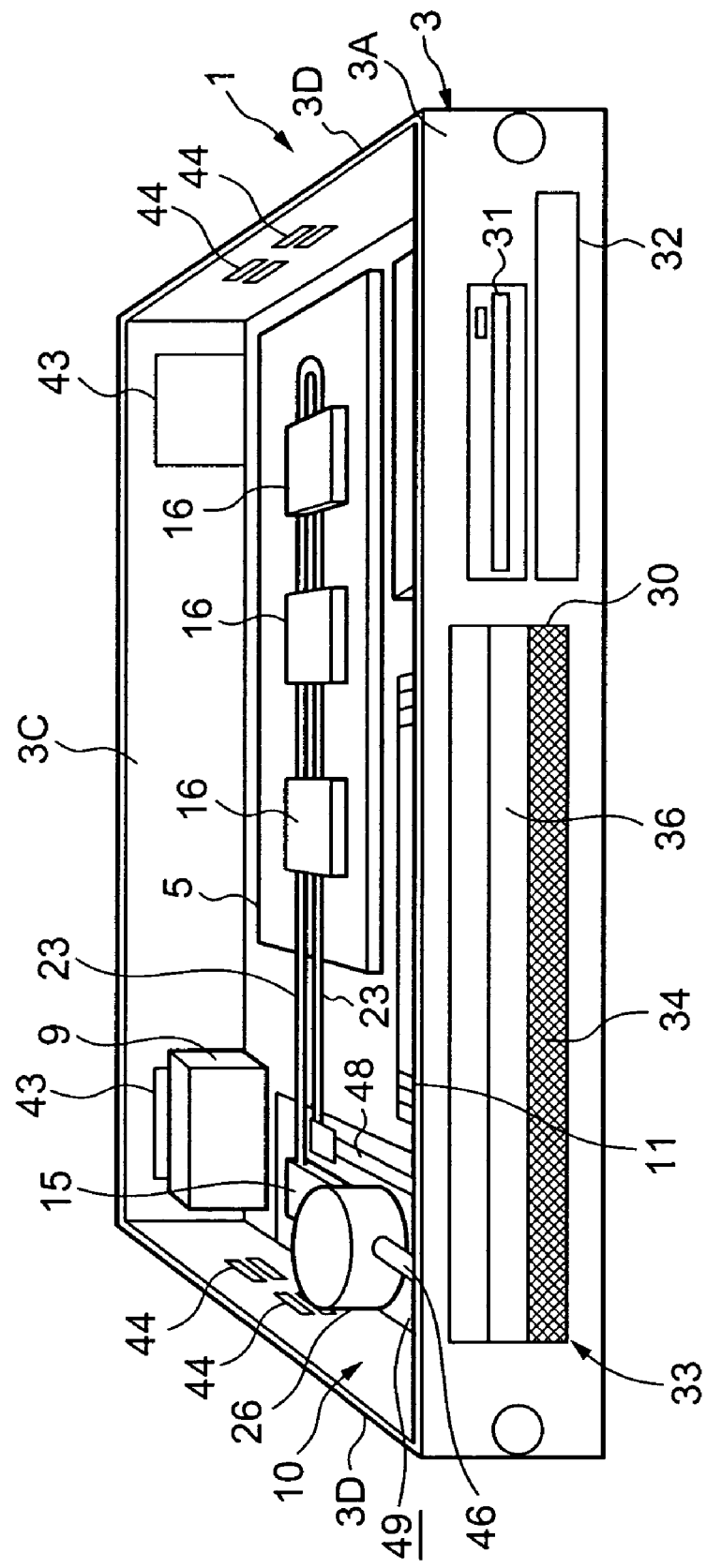
FIG. 3 is a perspective view showing a condition where a top cover of a case of the server shown in FIG. 2.

The preferred embodiments of the present invention will now be described in detail hereinafter with reference to the accompanying drawings.

In the diagrams, a server (a single server) 1 of this embodiment is central to providing various services to computers connected to a network. It is mounted in a frame 2B of a server rack 2 having casters 2A for carrying at the bottom. A plurality of the servers are vertically installed in a plurality of stages. Each server 1 contains a circuit board 5 mounted with a plurality of (or a single) semiconductor integrated circuit elements 6 such as LSIs or CPUs. Furthermore, a controller 52 is provided at the lower part of the server rack 2 for management of task allocation to the servers 1 or of operating conditions.

The server 1 contains and comprises the circuit board 5, a floppy disk drive 31, a CD-ROM drive 32, a supply circuit (power) 9, a connector (I/O) 8, and other electronic components, a plate-fin type heat exchanger 11, a cross flow fan 14, a brine circulation pump 15, a reserve tank 26 for storing brine, and a brine cooling unit 10 comprising cold plates 16 mounted in such a way as to enable a heat transfer from integrated circuit elements 6 and for cooling the integrated circuit elements 6, within a thin rectangular case 3, for example, having a height of 45 mm, a width of 450 mm, and a depth of 530 mm. The case 3 has a front face 3A, a bottom face 3B, a rear face 3C, right and left side faces 3D and 3D, with a top face covered with a detachable top cover 4.

In this case, the floppy disk drive 31 and the CD-ROM drive 32 face the front face 3A of the case 3 on its right and an opening 30 is formed on the left-hand side of the components. Furthermore, the heat exchanger 11 is arranged within the case 3 in such a way as to correspond to the inward portion of the opening 30. The heat exchanger 11 comprises a plurality of plates 12 having a transcalent property such as sheet aluminum arranged at 1-mm to 5-mm intervals and a meandering aluminum pipe 13, through which brine flows as described below, penetrating the plates 12 in such a way as to enable a heat transfer. If the plates 12 are arranged at short intervals, an air filter 34 having an appropriate size of mesh described later is preferably used. If they are arranged at long intervals, a safety structure such as a slit is used instead of the air filter 34.

Furthermore, a fan casing 39 for the cross flow fan 14 is arranged opposing to the opening 30 in the side of the opening 30 of the heat exchanger 11. Accordingly, the cross flow fan 14 is provided in the vicinity of the opening 30. The fan casing 39 is for use in forming an air way communicating from the opening 30 to the heat exchanger 11. The opening 33 of the fan casing 39 faces the outside with oriented downward from the opening 30 of the case 3 and the air filter 34 for dust exclusion is attached to the opening 33.

A curved opening angle adjustment plate 36 is attached like a window roof to the upper edge of the opening 33 of the fan casing 39. The opening angle adjustment plate 36 is free to be latched or released by ribs 37A, which is longitudinally provided in a protruding condition at specified intervals on a latch plate 37 provided in the upper portion of the inside of the opening 33. By changing the positions of the ribs 37A by moving them longitudinally for latching, an amount of protrusion from the upper edge of the opening 33 can be changed in three steps. This enables a change of an amount of protrusion in the extension of the fan casing 39, in other words, a change of the downward angle of the opening 33 in three steps such as, for example, 15 deg, 30 deg, and 45 deg to horizontal, thus achieving an effective air suction from a direction adjusted to the angle.

In this connection, in a computer room where this type of server rack 2 is installed, there is a circulation in which a cooling air is blown from the floor side and the air is taken into the ceiling side. On the other hand, a plurality of the servers 1 are installed in the server rack 2 as set forth in the above. Therefore, by adjusting the downward angle of the opening 33 to be smaller (closer to horizontal) for the upper servers 1 and adjusting the downward angle of the opening 33 to be larger (more downwardly oriented) for the lower servers 1, the cooling air coming up from the floor side can be easily and smoothly taken into the case 3 from the openings 33 of the servers 1 in respective stages for circulation within the case 3. The cooling air (cold air) is circulated in the case and then discharged from the rear face (back face) of the case 3.

The fan casing 39 is provided with a flap 38 for rectification located at the back of the cross flow fan 14, in other words, in the side of the heat exchanger 11, to prevent the air from the cross flow fan 14 from leaning to one side of the heat exchanger 11. In addition, the fan casing 39 is extended on both sides integrally with an air trunk member 41 extending to both sides of the plurality of plates 12 of the heat exchanger 11 at the back of the fan casing 39 and to the lower side of the plates 12. It should be noted that the air trunk member 41 may be formed by an extension separated from the fan casing 39.

In this connection, the upper edges of the plates 12 of the heat exchanger 11 contact against the top cover 4 of the case 3, while the lower edges of the plates 12 contact against the under surface of the air trunk member 41 contacting against the bottom face 3B of the case 3. Furthermore, the right and left faces of the air trunk member 41 are located in the right and left sides of the outermost plates 12, thus forming the casing of the heat exchanger 11. The air trunk member 41 of the fan casing 39 causes an air from the cross flow fan 14 to center on the plates 12 of the heat exchanger 11. This causes an air taken into the case 3 to be guided only to portions between the plates 12 of the heat exchanger, thus preventing deterioration in the heat exchange efficiency that occurs if the air is leaked to other portions and thus improving the efficiency of the heat exchange with a brine flow in the heat exchanger 11 described later.

In this case, the cross flow fan 14 is placed opposite in the longitudinal (horizontal) direction to the air inflow side (front side) of the heat exchanger 11. An air taken from the opening 30 (opening 33) is supplied linearly in the longitudinal direction of the heat exchanger 11. This enables an efficient air blow to the heat exchanger 11 by supplying the air taken into the case 3 by the cross flow fan 14 from the opening 30. Note that reference character 14M indicates a motor (a DC motor whose revolution speed changes according to an applied voltage) of the cross flow fan 14 and it is attached to an outer face of the fan casing 39.

Figure 6:
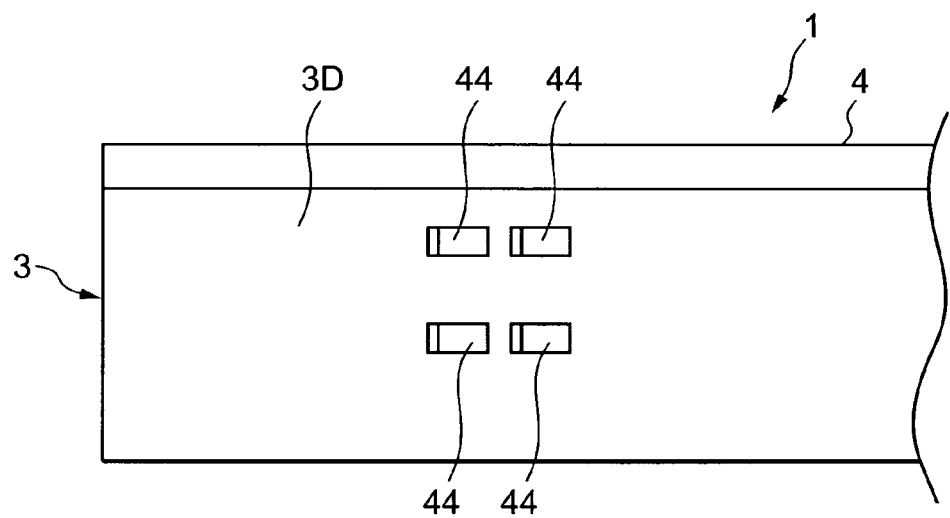
FIG. 6 is an expanded view of vent holes on a side surface of the case of the server shown in FIG. 2.

On the other hand, vent holes 42 and 42 are formed in the left and right portions on the rear face 3C of the case 3 and a blower fan 43 for exhaust ventilation is attached to each of the vent holes 42 and 42. The circuit board 5 is located between the heat exchanger 11 and the vent holes 42 and 42 and attached to the bottom face 3B of the case 3. Furthermore, the power supply circuit 9 is placed opposite to the left vent hole 42 inside. In addition, on the left and right side faces 3D and 3D of the case 3 in the position enclosing the circuit board 5, a plurality of vent holes 44 are formed by inwardly cutting and raising a part of the side faces 3D and 3D opposite to the circuit board 5 (FIG. 6). The cut and raised portions for the vent holes 44 are oriented obliquely toward behind.

When the cross flow fan 14 starts to operate, air taken into the case 3 from the opening 30 is blown against the heat exchanger 11 and passes through the portions between the plates 12 to reach the circuit board 5. Thereafter, the air passes around the cold plates 16 and the power supply circuit 9 and it is sucked into the blower fans 43 and 43 so as to be discharged to the outside from the vent holes 42 and 42. This forms a series of air ways from the opening 30 to the vent holes 42 and 42 in the case 3.

In addition, a fresh air (an air before passing the heat exchanger 11) is taken into the vent holes 44 formed on the side faces 3D and 3D by the above ventilation, passes around the cold plates 16 on the circuit board 5, and is discharged from the vent holes 42, 42 similarly. This prevents an abnormal temperature rise in the inside of the case 3 by using the air exposed to the heat exchange with the heat exchanger 11 and improves an air cooling effect of the cold plates 16. Furthermore, the vent holes 44 are formed by the cut and raised configuration, thereby improving productivity of the case 3.

An outlet 13A for the brine in the pipe 13 of the heat exchanger 11 is arranged at the upper end on the left side of the front as facing toward the heat exchanger 11. A pipe 46 connected to the outlet 13A is connected to an inlet of the reserve tank 26. A pipe 47 connected from an outlet of the reserve tank 26 is connected to a suction opening of the pump 15. A discharge opening of the pump 15 is connected to an inlet of an aluminum pipe 23 of the cold plates 16. An outlet of the pipe 23 is connected to a brine inlet 13B of the pipe 13 for the heat exchanger 11 via a pipe 48, thus forming a ring brine circulation path of the brine cooling unit 10. More specifically, the reserve tank 26 and the pump 15 are arranged in order in a brine stream flowing from the outlet 13A of the heat exchanger 11 to the cold plates 16. Furthermore, the brine is enclosed in the ring brine circulation path.

The brine is a liquid heat medium that will never be boiled by the heat generation of the integrated circuit elements 6:

antifreeze liquid is enclosed in this embodiment. In addition, the brine can be normal water, purified water, or HFE (hydrofluoroether).

Figure 7:
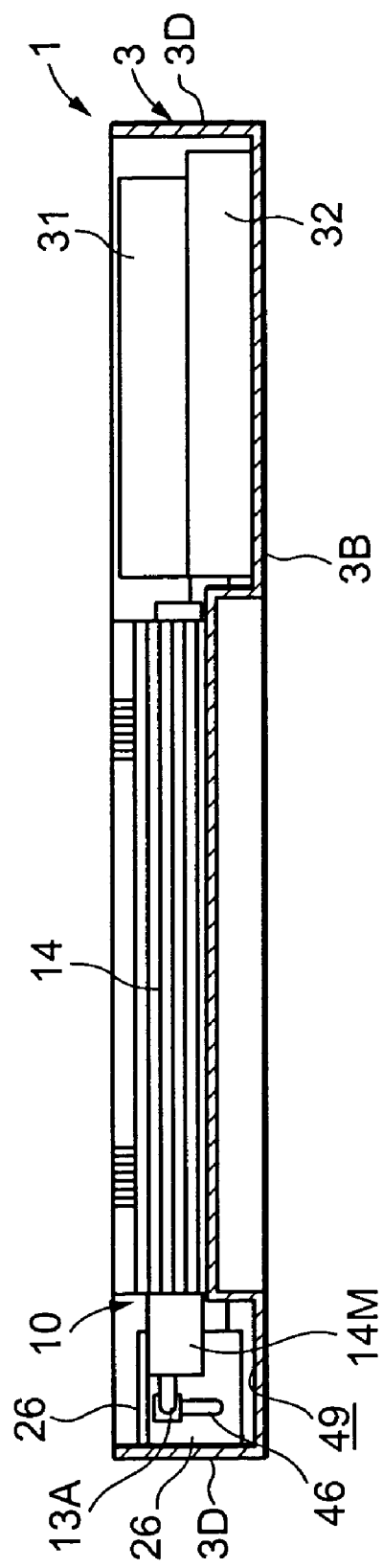
FIG. 7 is a vertical rear view of the server shown in FIG. 3.

In this case, the inlet 13B of the pipe 13 for the heat exchanger 11 is located just under the outlet 13A on the left side of the front of the heat exchanger 11. The inlet 13B and the outlet 13A (at least the outlet 13A) are arranged in positions higher than the cold plates 16. The bottom face 3B of the case 3 in the position corresponding to the downward portion of the heat exchanger 11 is set up higher than other parts (FIG. 7). This forms a lower portion 49 lower than a bottom edge of the heat exchanger 11 on the left side of the heat exchanger 11. All of the outlet 13A and the inlet 13B of the pipe 13 for the heat exchanger 11, the pipes 46 and 48, the reserve tank 26, the pump 15, and the pipe 47 (these pipes form a brine circulation line) are arranged in the lower portion 49 or above it correspondingly.

Figure 8:
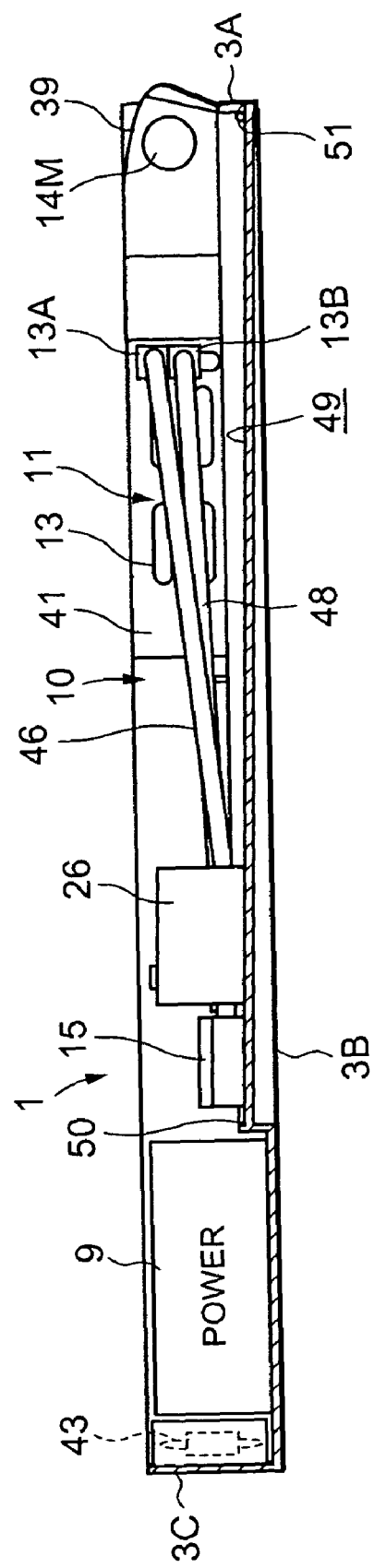
FIG. 8 is a vertical side view of the server shown in FIG. 3.

The circuit board 5 is raised with spacers and attached in a position higher than the upper surface of the lower portion 49. The reserve tank 26 and the pump 15 are arranged at a front end on the lower portion 49. Furthermore, the upper surface of the lower portion 49 is sloping forward downwardly as a whole (FIG. 8). At the lowest forward end, a detection sensor 51 is attached to detect brine standing there, if any.

According to this constitution, even if brine leaks due to any crack or damage on the connections between the outlet 13A and the inlet 13B of the pipe 13 for the heat exchanger 11, the pipes 46, 47, 48, and 23, the reserve tank 26, and the pump 15 or on these components, the brine leakage flows down along the slope of the lower portion 49 on the bottom face 3B of the case 3 so as to be collected in the front end inside the lower portion 49. This enables as much delay as possible and leads to a prevention of a disadvantage such as a failure caused by the brine leakage into the circuit board 5, the integrated circuit elements 6 mounted thereon, the pump 15, and the heat exchanger 11. Particularly the outlet 13A of the heat exchanger 11 is located in a position higher than the cold plates 16. Therefore, even if a poor connection occurs between the outlet 13A and the pipe 48, it becomes possible to minimize the amount of brine leaking from the heat exchanger 11 until the pump 15 is stopped as described later. The brine having leaked to the lower portion 49 is detected by the detection sensor 51 as described above and then the pump 15 is halted and an alarm is output as described later. Between the lower portion 49 and the heat exchanger 11 and the circuit board 5, a rib 50 is arranged in a standing condition from the bottom face 3B of the case 3 to prevent the brine leakage from flowing into the circuit board 5.

Figure 9:
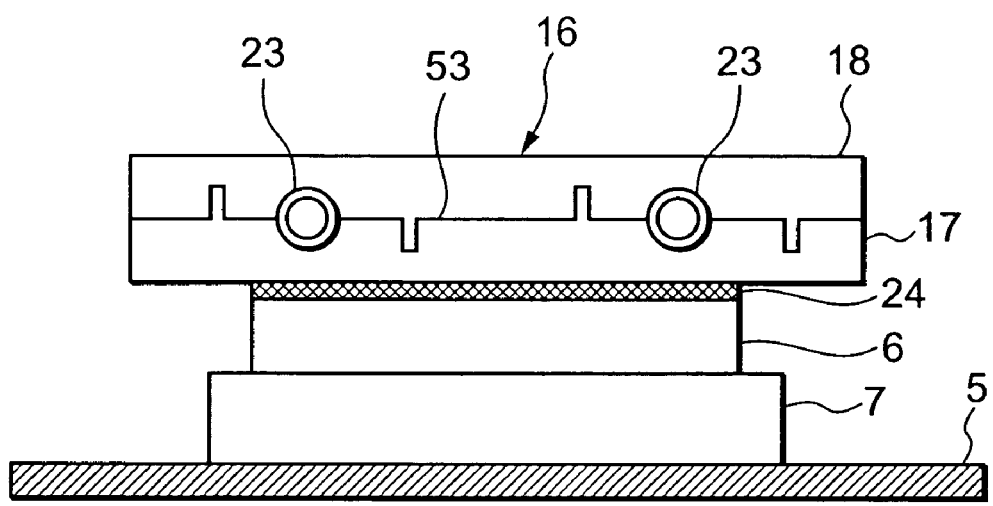
FIG. 9 is a side view of an integrated circuit element and a cold plate mounted on a circuit board of the server shown in FIG. 3.

On the circuit board 5, the plurality of (three in this embodiment, though one is possible) semiconductor integrated circuit elements 6 are mounted as set forth above. The integrated circuit elements 6 are arranged linearly at specified intervals and they are mounted on the circuit board 5 via sockets, respectively (FIG. 9). The cold plates 16 are mounted on the integrated circuit elements 6, respectively, in such a way as to exchange heat and grease 24 having high heat conductivity is applied to a portion between each cold plate 16 and each integrated circuit element 6. The grease 24 makes the integrated circuit element 6 and the cold plate 16 closely stick together, thereby transmitting the heat of the integrated circuit element 6 to the cold plate efficiently. Note that it is also possible to use elastic sheet material having good heat conductance as described later instead of the grease 24.

The cold plate 16 is formed, for example, by laminating two aluminum plates (heat conductive material) having high heat conductivity (good heat conductance) with caulking. More specifically, the cold plate 16 comprises a plate-type base member 17 as the heat conductive material located on the side of the integrated circuit element 6 and a plate-type cover member 18 as the heat conductive material laminated and stick close to the base member 17, with the pipe 23 sandwiched between the base member 17 and the cover member 18 as set forth in the above (FIG. 9).

Figure 10:
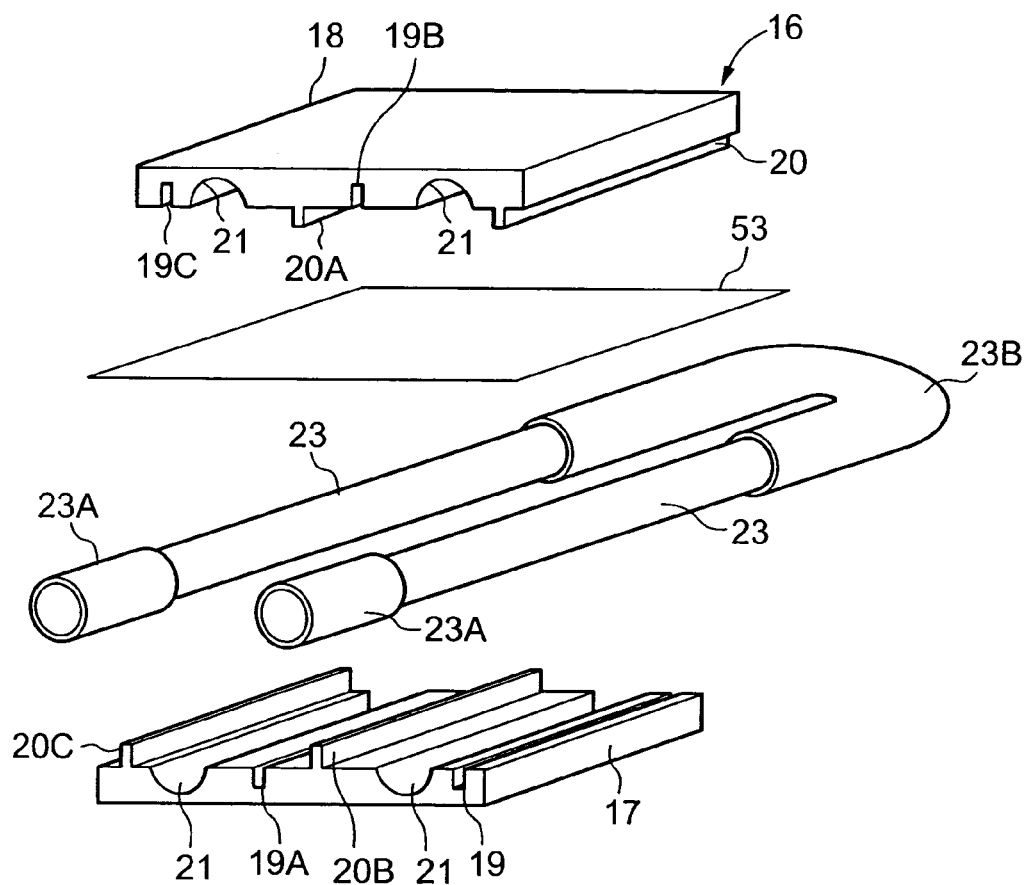
FIG. 10 is an exploded perspective view of the cold plate shown in FIG. 9.

The base member 17 has a plurality of (in this embodiment, a pair of) pipe grooves 21 from its front end to rear end: the pipe grooves 21 are formed in parallel at specified intervals (FIG. 10). The pipe grooves 21 and 21 are formed into a concavity as a semicircular arc corresponding to the outer circumferential shape of the pipe 23 and both pipe grooves 21 and 21 are formed at a given distance from both sides of the base member 17 on the inside thereof.

In addition, an engagement groove (concavity) 19 having a given depth and a given width is formed between one pipe groove 21 and one side portion of the base member 17 from the front end to rear end of the base member 17. The engagement groove 19 is formed in an almost U-shaped cross section and in a concavity on the base member 17 almost in parallel to the pipe groove 21. Furthermore, an engagement groove 19A is formed in parallel to the pipe groove 21 from the front end to rear end of the base member 17 between both pipe grooves 21 and the engagement groove 19A is formed in the same manner as for the engagement groove 19.

The base member 17 also has an engagement protrusion (convexity) 20B having a given height and a given width formed from its front end to rear end. The engagement protrusion 20B is formed in such a way as to be protruding from the base member 17 and it is located between one pipe groove 21 and the engagement groove 19A in such a way as to be formed in parallel to the pipe groove 21. Furthermore, the base member 17 has an engagement protrusion 20C formed from its front end to rear end. The engagement protrusion 20C is formed in the same shape as for the engagement protrusion 20B and it is located on the other side of the other pipe groove 21, which is the opposite side to the engagement groove 19A. In other words, the engagement groove 19, the pipe groove 21, the engagement protrusion 20B, the engagement groove 19A, the pipe groove 21, and the engagement protrusion 20C are formed at specified intervals in order from one side of the base member 17, and all of them are formed on one side of the base member 17.

On the other hand, a plurality of (two) pipe grooves 21 are formed on the cover member 18. These pipe grooves 21 are formed in the same shapes as for the pipe grooves 21 formed on the base member 17. The pipe grooves 21 on the cover member 18 are formed in the positions opposite to the pipe grooves 21 on the base member 17 when the cover member 18 is placed on the base member 17 in superposed relation, by which the pipes 23 and 23 are sandwiched between the pipe grooves 21 formed on the base member 17 and the cover member 18.

At this point, there is provided sheet material 53 having heat conductance and elasticity made of a thin graphite sheet or the like having a thickness of 50 $\mu$ or so between the pipe 23 and the cover member 18 so as to be sandwiched between the base member 17 and the pipe 23 and the cover member 18. Note that the sheet material can be put on the other side of the pipe 23 or on the side of the base member 17. Furthermore, it can be provided between the integrated circuit element 6 and the cold plate 16 as set forth in the above or can be attached to the upper surface of the cold plate 16. As the material of the sheet material 53, it is possible to use a copper foil.

The sheet material 53 has good heat conductance in the surface direction, thus enabling a good heat transfer between the pipe 23 and the base member 17 and the cover member 18 in a wide range and improving the heat conductance efficiency. The action causes a very smooth heat transfer from the integrated circuit element 6 to the brine flowing through the pipe 23 of the cold plate 16. Note that the grease described above can be applied to a surface where the sheet material 53 is not provided (for example, the upper surface of the base member 17 in FIG. 10).

In this case, the cover member 18 has engagement protrusions 20 and 20A similar to the engagement protrusions 20B and 20C from its front end to rear end. The engagement protrusions 20 and 20A are formed in positions opposite to the engagement grooves 19 and 19A on the base member 17. The both engagement protrusions 20 and 20A are pushed and mated in the engagement grooves 19 and 19A, respectively, when the cover member 18 is placed on the base member 17 in superposed relation. Furthermore, the cover member 18 has engagement groves 19B and 19C similar to the engagement grooves 19 and 19A from its front end to rear end. The engagement grooves 19B and 19C are formed in positions opposite to the engagement protrusions 20B and 20C on the base member 17. When the cover member 18 is placed on the base member 17 in superposed relation, the engagement protrusions 20B and 20C are pushed and mated in the engagement grooves 19B and 19C, respectively.

More specifically, for the cold plate 16, the pipes 23, 23 and the sheet material 53 described above are sandwiched between the base member 17 and the cover member 18 (pipe grooves 21 and 21) in superposed relation. Then, the engagement protrusions 20 and 20A and the engagement protrusions 20B and 20C are pushed and mated in the engagement groves 19 and 19A and the engagement grooves 19B and 19C, respectively, for caulking, thereby fixing the base member 17 and the cover member 18 by close contact. At this point, the peripheries of the pipes 23 and 23 are closely fixed to the base member 17 and the cover member 18 (via the sheet material). Both of the pipes 23 and 23 are protruding from the front and rear ends of the base member 17 and the cover member 18.

Three cold plates 16 in the above configuration are prepared in this embodiment. The ends of the pipes 23 of the cold plates 16 are connected with connectors 23A. At this point, the cold plates 16 are connected to each other on the three integrated circuit elements 6 mounted on the circuit board 5 with dimensions corresponding to the locations, and the pipes 23 of the cold plate 16 in one side are connected to each other with a bend pipe (circular pipe) 23B.

With this connection of the cold plates 16, a linear brine passage with a pair of back and forth channels is formed between the cold plates 16. It is also possible to make a linear brine passage having a plurality of pairs of back and forth channels between the cold plates 16 by providing more pipes 23. The cold plates 16 are fixed with a contact to the respective integrated circuit elements 6 via the grease 24 having a high heat conductivity as described above (FIG. 9).

In the three cold plates 16 connected in this manner, the left ends of the pipes 23 for the cold plates 16 located in the opposite position to the bend pipe 23B are connected to the discharge opening from the pump 15 and to the pipe 48 connected to the heat exchanger 11 in the upper part of the lower portion 49.

Figure 11:
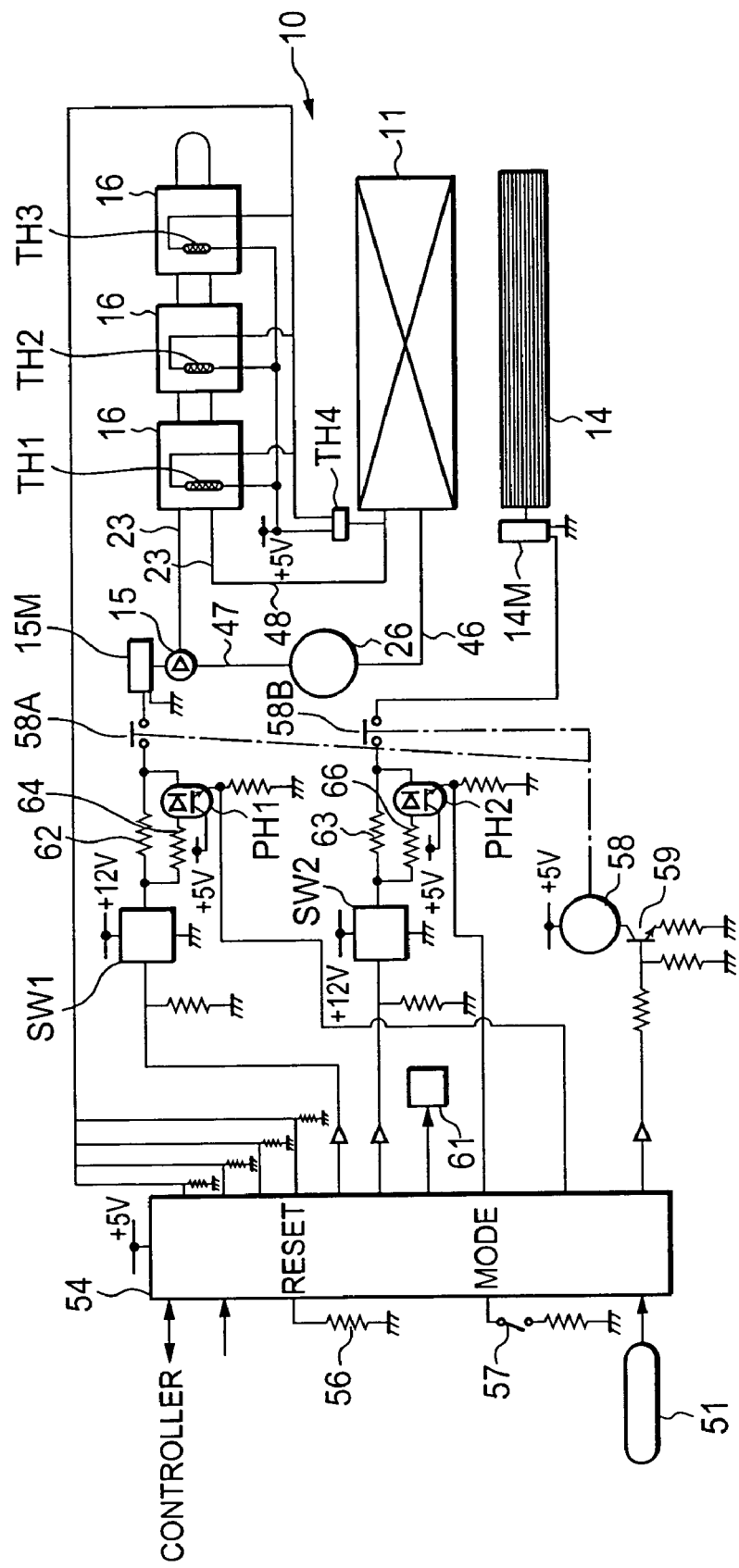
FIG. 11 is an electrical diagram of a brine cooling unit of the server shown in FIG. 3.

Subsequently, referring to FIG. 11, there is shown an electrical diagram of the brine cooling unit 10 for the server 1. In this diagram, there is shown a general-purpose microcomputer comprising a control unit and a detection unit. An input port of the microcomputer 54 is connected to thermistors TH1, TH2, and TH3 for detecting temperatures of the cold plates 16 with being attached to the cold plates 16 so as to exchange heat (or for detecting the temperatures in the vicinity of the integrated circuit elements 6) and to a thermistor TH4 for detecting a brine return temperature to the heat exchanger 11 with being attached to the inlet 13B of the pipe 13 for the heat exchanger 11 or to the pipe 48 connected thereto in such a way as to exchange heat.

Furthermore, the input port of the microcomputer 54 is also connected to a resistance 56 (such as a volume) for setting the maximum value Tmax (for example, +80° C.) of the brine return temperature and to a mode switch 57. A voltage varying based on a temperature detection of the detection sensor 51 is applied to an A/D (analog/digital conversion) input port of the microcomputer 54. A power ON (coupled to the power supply) reset signal is input to the reset input port of the microcomputer 54. Furthermore, the microcomputer 54 exchanges data to or from the controller 52.

A signal output from an output port of the microcomputer 54 is supplied to switching power supply circuits SW1 and SW2 via a buffer and output voltages of the switching power supply circuits SW1 and SW2 are controlled within a range of +6V to +12V in this embodiment. A transistor 59 controlling whether a relay 58 (relay coil) is energized is connected via a buffer to the microcomputer 54, which controls the ON/OFF switching. In addition, the output of the microcomputer 54 is connected to an LED indicator 61.

A voltage DC +12V output from the power supply circuit 9 is supplied to the switching power supply circuits SW1 and SW2. An output from the switching power supply circuit SW1 is supplied to a motor 15M of the pump 15 via a resistance 62 and a normally open contact 58A of the relay 58. An output from the switching power supply circuit SW2 is supplied to a motor 14M of the cross flow fan 14 via a resistance 63 and a normally open contact 58B of the relay 58.

Furthermore, a resistance 64 and a series circuit of a light-emitting diode of a photo coupler PH1 are connected in parallel with the resistance 62 in the output side of the switching power supply circuit SW1. An output of a phototransistor of the photo coupler PH1 is connected to the input port of the microcomputer 54. A resistance 66 and a series circuit of a light-emitting diode of a photo coupler PH2 are connected in parallel with the resistance 63 in the output side of the switching power supply circuit SW2. An output of a phototransistor of the photo coupler PH2 is connected to the input port of the microcomputer 54.

Figure 12:
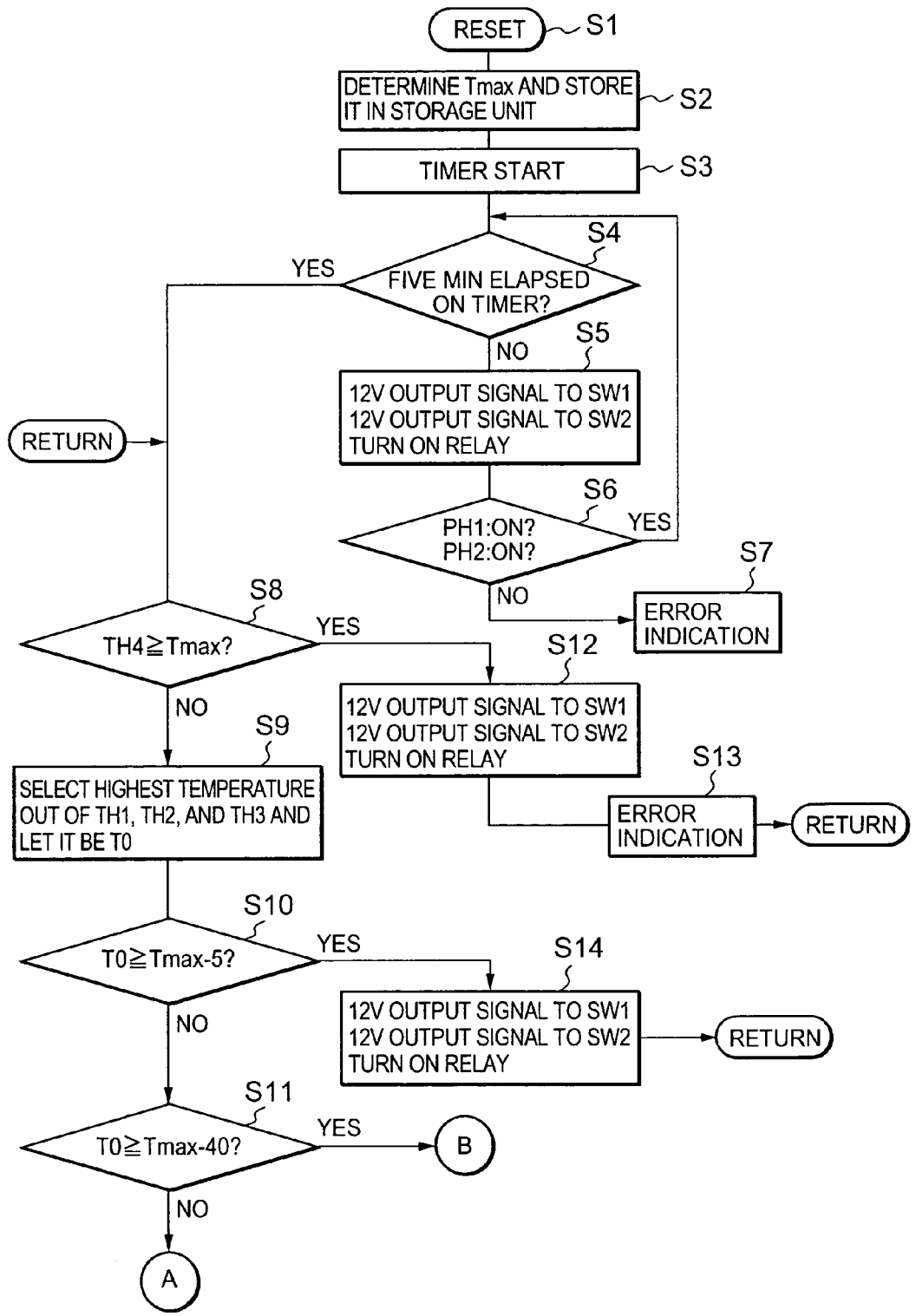
FIG. 12 is a flowchart illustrating a control operation of the microcomputer shown in FIG. 11.
Figure 13:
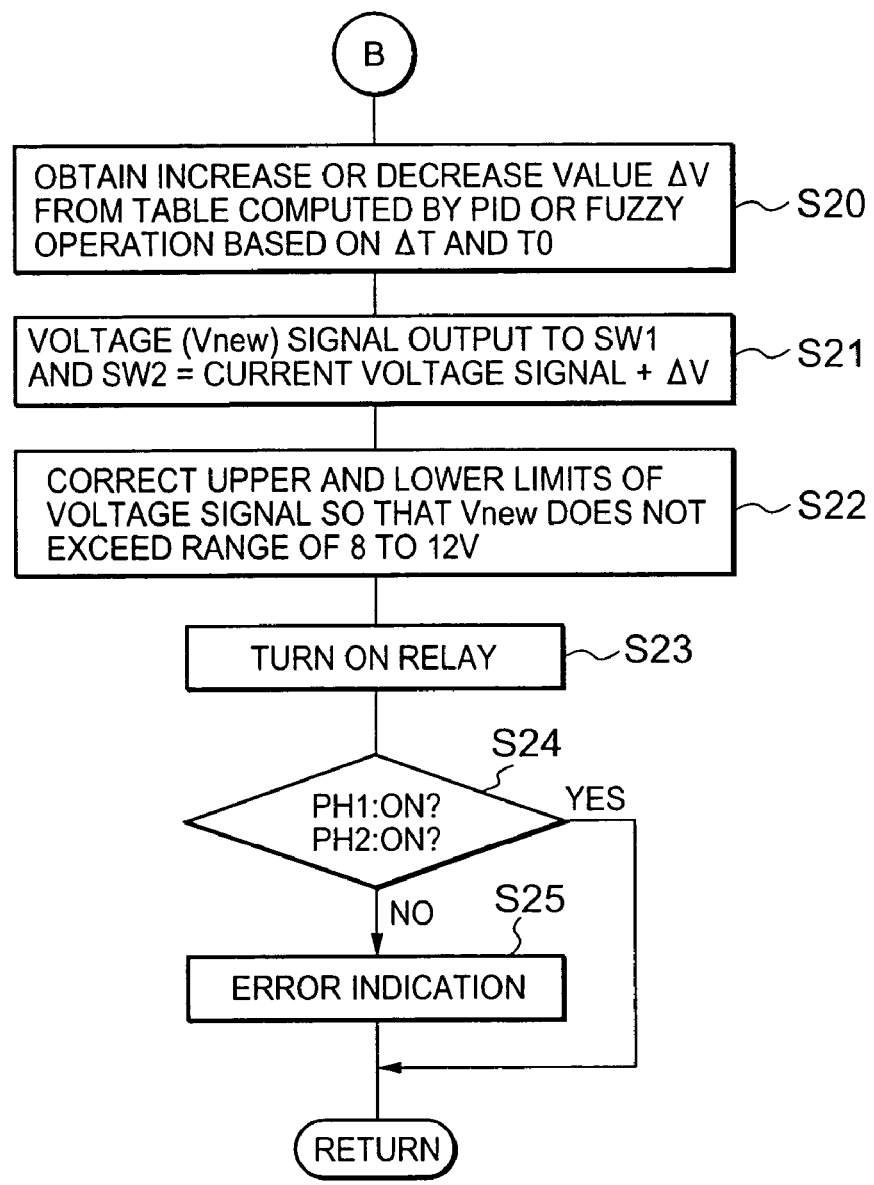
FIG. 13 is another flowchart illustrating the control operation of the microcomputer shown in FIG. 11.

With the above constitution, an operation of the brine cooling unit 10 for the server 1 with controls of the microcomputer 54 will be described hereinafter by referring to flowcharts shown in FIGS. 12 to 14. When the power is turned on, a power ON reset signal is input to the microcomputer 54 in step S1 in FIG. 12. For the reset signal, the microcomputer 54 uses an edge trigger of DC +5V to be a power supply of the relay 58 and the photo couplers PH1 and PH2.

Subsequently, the microcomputer 54 determines the maximum Tmax of the brine return temperature set at the resistance 56 and stores it into the storage unit (memory) in step S2. In this embodiment, Tmax is assumed to be set to +80° C. Then, the microcomputer 54 starts counting on a timer (for example, 5-min timer), which is its own function, in step S3. In step S4, it determines whether a time of five minutes has elapsed since the timer counting is started. Unless the time has elapsed, the control progresses to step S5, in which voltage signals indicating an output of DC +12V are output to the switching power supply circuits SW1 and SW2, respectively, and then the transistor 59 is turned on to energize the relay 58. The energized relay 58 closes the contacts 58A and 58B.

By this operation, DC +12V is supplied to the motor 15M of the pump 15 and the motor 14M of the cross flow fan 14, thereby both of which are operated with the maximum power. When the cross flow fan 14 is operated, an air is sucked from the opening 30 of the case 3 as described above and blown against the heat exchanger 11 linearly in a longitudinal direction. Thereafter, the air after cooling the plates 12 of the heat exchanger 11 and the pipe 13 passes around the cold plates 16 on the circuit board 5 and the power supply circuit 9 for cooling. Then, the air is discharged to the outside from the vent holes 42 and 42 by means of the blower fans 43 and 43.

As set forth in the above, a fresh air is taken into the vent holes 44 formed on the side faces 3D and 3D and passes around the cold plates 16 on the circuit board 5 and the power supply circuit 9 for cooling. Thereafter, the air is discharged to the outside from the vent holes 42 and 42 similarly.

On the other hand, an operation of the pump 15 causes brine to be discharged from the discharge opening. In a process of passing through the pipe 23, the brine exchanges heat with the cold plates 16 sequentially and then reaches the inlet 13B of the pipe 13, flowing through the pipe 48. The brine that has entered the inlet 13B exchanges heat with the pipe 13 and the plates 12 in a process of meandering in the pipe 13 within the heat exchanger 11 and it is cooled by the ventilating air from the cross flow fan 14.

The brine discharged from the outlet 13A of the pipe 13 for the heat exchanger 11 reaches the reserve tank 26 via the pipe 46 and then it is sucked from the suction opening of the pump 15 via the reserve tank 26 to repeat the circulation. In this manner, the brine cooled by the heat exchanger 11 cools the cold plates 16 and then the cold plates 16 cool the integrated circuit elements 6.

In step S6, the microcomputer 54 determines whether the phototransistors of the photo couplers PH1 and PH2 are on. If no output is generated from the switching power supply circuit SW1 nor SW2, the light-emitting diodes of the photo coupler PH1 and PH2 do not emit light and the phototransistors are off. If the phototransistors of the photo couplers PH1 and PH2 are on, the microcomputer 54 determines that the outputs are generated from the switching power supply circuits SW1 and SW2 and then returns to step S4. If the phototransistors of the photo couplers PH1 and PH2 are off, an error is expected in the pump 15 or the cross flow fan 14 and therefore the control progresses from step S6 to step S7 to indicate an error on the LED indicator 61, thereby outputting an alarm.

After turning on the power supply, the microcomputer 54 continues the operation of the cross flow fan 14 and the pump 15 at the maximum power until the timer counts up the predetermined time to cope with the heat generation at the startup of the server 1 and to stabilize the cooling capacity of the brine cooling unit 10. When the timer counts up the time after an elapse of five minutes since the power supply is turned on, the microcomputer 54 progresses from step S4 to step S8 to determine whether the brine return temperature detected by the thermistor TH4 is equal to or higher than the maximum value Tmax.

If the temperature of the brine that has returned after the heat exchange with the cold plates 16 rises to a temperature equal to or higher than Tmax, the microcomputer 54 progresses to step S12 to continue the operation of the cross flow fan 14 and the pump 15 at the maximum power in the same manner as for the above, indicates an error on the LED indicator 61, and returns to step S8. This suggests a condition where the cold plates 16 do not cool the integrated circuit elements 6 effectively, by which an alarm is output.

On the other hand, if the brine return temperature is lower than Tmax in step S8, the microcomputer 54 progresses to step S9 to download temperatures of the cold plates 16 detected by the thermistors TH1, TH2, and TH3. Then, the highest temperature is selected out of the temperatures detected by the thermistors TH1 to TH3 and it is considered T0. Subsequently, it is determined whether T0 is equal to or higher than Tmax minus 5 (or +75° C.) in step S10. If it is equal to or higher than the temperature, the microcomputer 54 progresses to step S14 to operate the cross flow fan 14 and the pump 15 at the maximum power in the same manner as for the above. Then, it returns to step S8.

If T0 is lower than Tmax minus 5 in step S10, the microcomputer 54 progresses to step S11 to determine whether T0 is equal to or higher than Tmax minus 40 (or +40° C.). If T0 is equal to or higher than Tmax minus 40 and lower than Tmax minus 5 (in other words, equal to or higher than +40° C. and lower than +75° C.), the microcomputer 54 progresses to step S20 in FIG. 13.

In step S20, increase or decrease values $\Delta V$ of the output voltages of the switching power supply circuits SW1 and SW2 are obtained from a data table previously computed by the PID (proportional plus integral plus derivative) or fuzzy operation on the basis of $\Delta T$ obtained from a deviation (change) of the current T0 from the previous T0. A routine cycle in this case is, for example, 0.5 sec. In the operation in step S20, the computation is made in such a way that the power of the pump 15 or the cross flow fan 14 is increased in response to a brine temperature rise and it is decreased in response to a temperature drop so that the temperature of the cold plates 16 becomes a setting value within the range of +50° C. to +70° C. when the temperature of the periphery of the case 3 is equal to or higher than +35° C. The setting value can also be controlled by the controller 52 according to the operating ratio of the server 1 or can be arbitrarily set manually.

Subsequently, in step S21, the microcomputer 54 controls a voltage signal Vnew output to the switching power supply circuit SW1 and SW2 to be the current voltage signal plus $\Delta V$ in the above. Then, in step S22, it corrects the voltage signal so that the voltage signal Vnew does not exceed the range of the lower limit DC +8V to the upper limit +12V and energizes the relay 58. By this operation, the pump 15 and the cross flow fan 14 are operated at the adjusted power.

In step S24, the microcomputer 54 determines whether the phototransistors of the photo couplers PH1 and PH2 are on in the same manner as for the above. If no output is generated from the switching power supply circuits SW1 and SW2, the light-emitting diodes of the photo couplers PH1 and PH2 emit no light, and the phototransistors are off, an error is indicated on the LED indicator 61 to output an alarm in the same manner as for the above in step S25. If the switching power supply circuits SW1 and SW2 are normal, the microcomputer 54 returns to step S8.

Figure 14:
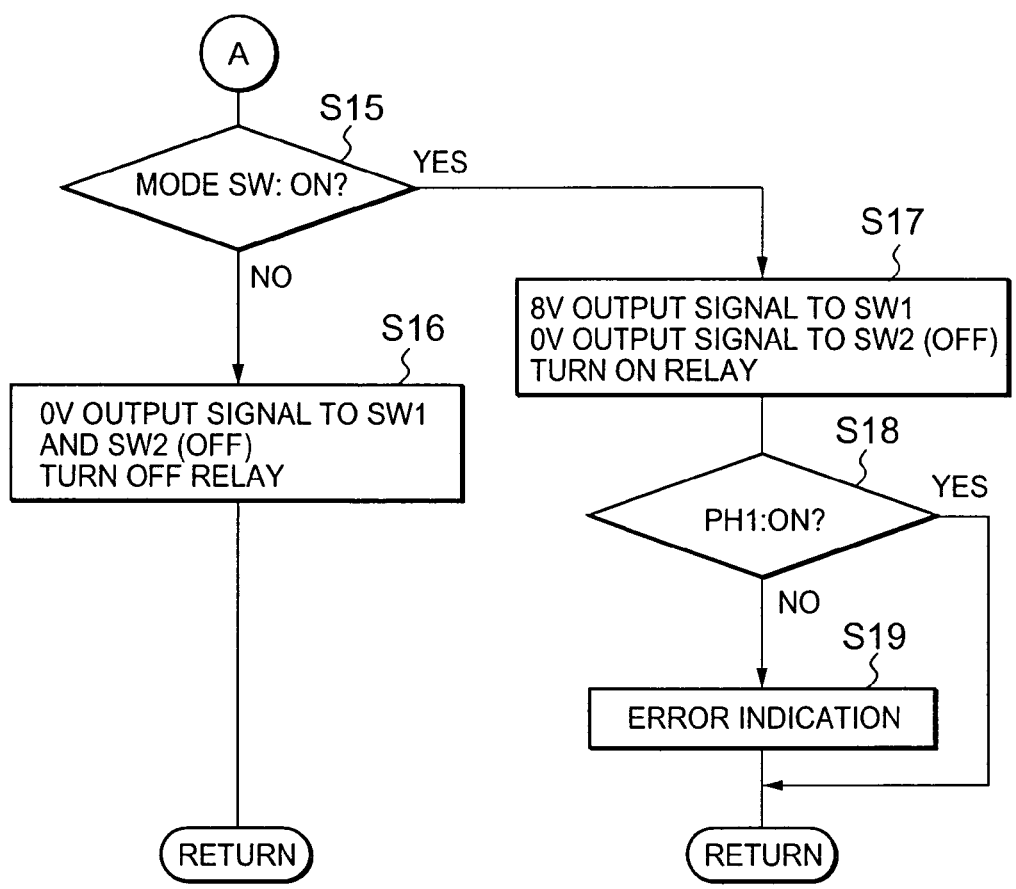
FIG. 14 is still another flowchart illustrating the control operation of the microcomputer shown in FIG. 11.

On the other hand, in step S11, if T0 is lower than Tmax minus 40 (or +40° C.), the microcomputer 54 progresses to step S15 in FIG. 14 to determine whether the mode switch 57 is on. Assuming that the mode switch 57 is on at this point, the microcomputer 54 progresses from step S15 to step S17 to output a voltage signal of DC +8V to the switching power supply circuit SW1, to output a voltage signal of 0V to the switching power supply circuit SW2, and to energize the relay 58.

This causes the pump 15 to be operated at the lowest power, by which the minimum brine circulation is secured in the brine circulation path of the brine cooling unit 10, while the cross flow fan 14 is halted to interrupt the ventilation. Accordingly, if the brine return temperature is lower than +40° C., the microcomputer 54 maintains the minimum cooling of the integrated circuit elements 6 with the brine cooling unit 10 when the mode switch 57 is on. In step S18, the microcomputer 54 determines whether an output is generated from the switching power supply circuit SW1 by means of the phototransistor of the photo coupler PH1 in the same manner as for the above. If no output is generated, an error is indicated on the LED indicator 61 similarly. In either case, the microcomputer 54 returns to step S8.

On the other hand, if the mode switch 57 is off, the microcomputer 54 progresses from step S15 to step S16 to output a voltage signal of 0V to the switching power supply circuits SW1 and SW2 so that the relay 58 is not energized and to return to step S8. In other words, if the brine return temperature is lower than +40° C. and the mode switch 57 is off, the microcomputer 54 halts the cooling of the integrated circuit elements 6 with the brine cooling unit 10.

Subsequently, referring to FIGS. 15 and 16, there is shown a flowchart of the control with the microcomputer 54 according to another embodiment. The controller 52 provided in the server rack 2 computes an operating ratio of the integrated circuit elements 6 through data communication with each server 1. A temperature rise of the integrated circuit elements 6 can be grasped from the operating ratio and the operating ratio is transmitted to the microcomputer 54. This flowchart shows a control with the operating ratio.

Figure 15:
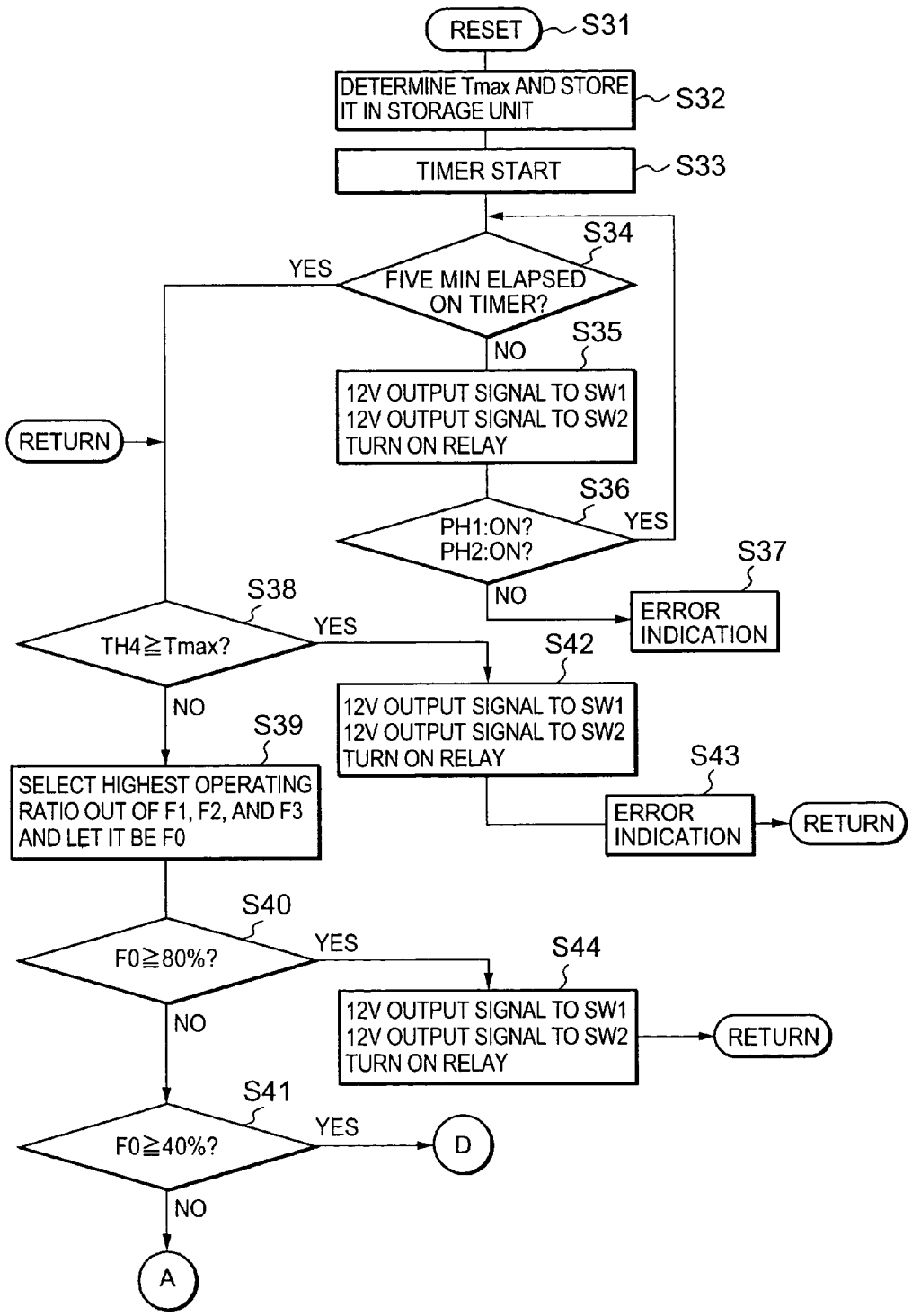
FIG. 15 is a flowchart illustrating a control operation of another embodiment of the microcomputer shown in FIG. 11.
Figure 16:
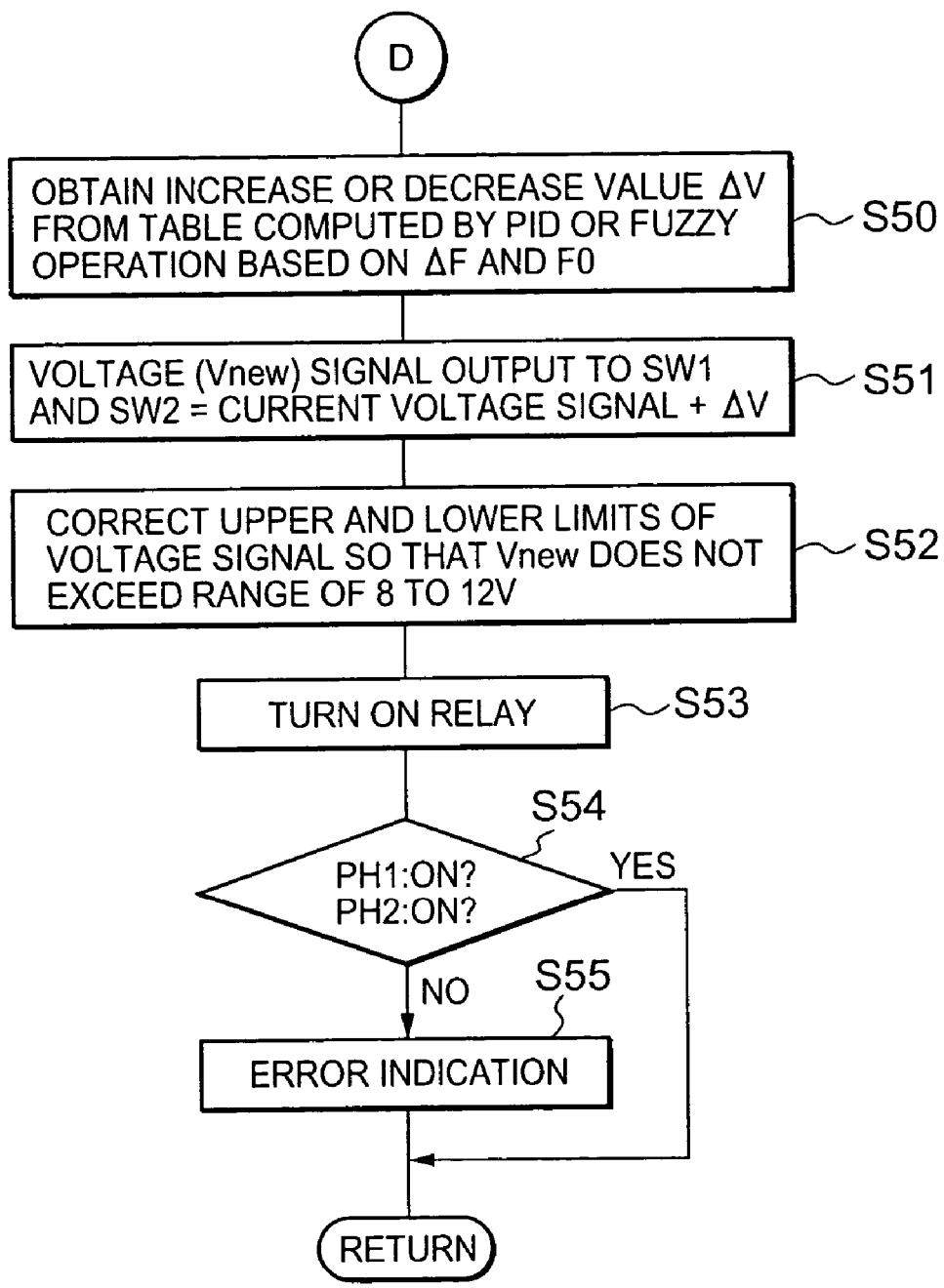
FIG. 16 is another flowchart illustrating the control operation of another embodiment of the microcomputer shown in FIG. 15.

More specifically, when the power supply is turned on, a power ON reset signal as described above is input to the microcomputer 54 in step S31 in FIG. 15. Subsequently, the microcomputer 54 determines the maximum value Tmax of the brine return temperature set at the resistance 56 and stores it into the storage unit (memory) in step S32. In this case, Tmax is assumed to be set to +80° C., too. Then, the microcomputer 54 starts counting on the timer (5-min timer described above), which it has as its own function, in step S33. In step S34, the microcomputer 54 determines whether a time of five minutes has elapsed since the timer counting is started. Unless the time has elapsed, the microcomputer 54 progresses to step S35 to output a voltage signal indicating that DC +12V is output to the switching power supply circuits SW1 and SW2 to turn on the transistor 59, thereby energizing the relay 58. The energized relay 58 causes the contacts 58A and 58B to be closed.

By this operation, DC +12V is supplied to the motor 15M of the pump 15 an the motor 14M of the cross flow fan 14 and both are operated at the maximum power in the same manner as for the above. The microcomputer 54 determines whether the phototransistors of the photo couplers PH1 and PH2 are on in step S36. If outputs are generated from the switching power supply circuit SW1 and SW2 and the phototransistors of the photo couplers PH1 and PH2 are on, the microcomputer 54 determines that the outputs are generated from the switching power supply circuits SW1 and SW2 and returns to step S34. If the phototransistors of the photo couplers PH1 and PH2 are off, the microcomputer 54 progresses from step S36 to step S37 to indicate an error on the LED indicator 61, thereby outputting an alarm.

After turning on the power supply, the microcomputer 54 continues the operation of the cross flow fan 14 and the pump 15 at the maximum power until the timer counts up the predetermined time to stabilize the cooling capacity of the brine cooling unit 10. When the timer counts up the time after an elapse of five minutes since the power supply is turned on, the microcomputer 54 progresses-from step S34 to step S38 to determine whether the brine return temperature detected by the thermistor TH4 is equal to or higher than the maximum value Tmax.

If the temperature of the brine that has returned after the heat exchange with the cold plates 16 rises to a temperature equal to or higher than Tmax, the microcomputer 54 progresses to step S42 to continue the operation of the cross flow fan 14 and the pump 15 at the maximum power in the same manner as for the above, indicates an error on the LED indicator 61, and returns to step S38. This gives an alarm of an abnormal high temperature of the integrated circuit elements 6.

On the other hand, if the brine return temperature is lower than Tmax in step S38, the microcomputer 54 progresses to step S39 to download operating ratios F1, F2, and F3 of the integrated circuit elements 6 sent from the controller 52. Then, the highest operating ratio is selected out of the operating ratios F1 to F3 and it is considered F0. Subsequently, it is determined whether F0 is, for example, 80% or higher in step S40. If it is so, the microcomputer 54 progresses to step S44 to operate the cross flow fan 14 and the pump 15 at the maximum power in the same manner as for the above. Then, the microcomputer returns to step S38.

If F0 is lower than 80% in step S40, the microcomputer 54 progresses to step S41 to determine whether F0 is, for example 40% or higher. If F0 is 40% or higher and lower than 80%, the microcomputer 54 progresses to step S50 in FIG. 16.

In step S50, increase or decrease values ΔV of the output voltages of the switching power supply circuits SW1 and SW2 are obtained from a data table previously computed by the PID (proportional plus integral plus derivative) or fuzzy operation on the basis of a deviation (change) of the current F0 from the previous F0. A routine cycle in this case is, for example, 0.5 sec. In the operation in step S50, the computation is made in such a way that the power of the pump 15 or the cross flow fan 14 is increased in response to a brine temperature rise and it is decreased in response to a temperature drop so that the temperature of the cold plates 16 is +70° C. or lower when the temperature of the outside of the case 3 is +35° C. The setting value can also be controlled by the controller 52 according to the operating ratio of the server 1 or can be arbitrarily set manually.

Subsequently, in step S51, the microcomputer 54 controls a voltage signal Vnew output to the switching power supply circuit SW1 and SW2 to be the current voltage signal plus ΔV in the above. Then, in step S52, it corrects the voltage signal so that the voltage signal Vnew does not exceed the range of the lower limit DC +8V to the upper limit +12V and energizes the relay 58. By this operation, the pump 15 and the cross flow fan 14 are operated at the adjusted power. This control enables a rapid increase of the cooling capacity against a sudden heat generation of the integrated circuit elements 6 so as to prevent an occurrence of a damage on the integrated circuit elements.

In step S54, the microcomputer 54 determines whether the phototransistors of the photo couplers PH1 and PH2 are on in the same manner as for the above. If no output is generated from the switching power supply circuits SW1 and SW2, the light-emitting diodes of the photo couplers PH1 and PH2 emit no light, and the phototransistors are off, an error is indicated on the LED indicator 61 to output an alarm in the same manner as for the above in step S55. If the switching power supply circuits SW1 and SW2 are normal, the microcomputer 54 returns to step S38.

On the other hand, in step S41, if F0 is lower than 40%, the microcomputer 54 progresses to step S15 in FIG. 14 to execute the same control thereafter. The control in FIG. 14 is the same as one described above. Therefore, its description is omitted here. As set forth in the above, the brine cooling unit 10 can be controlled by using the operating ratios of the integrated circuit elements 6.

At this point, if the detection sensor 51 detects the brine, the microcomputer 54 indicates an error on the LED indicator 61 to output an alarm in response to the detection. At the same time, it outputs a voltage signal of 0V to the switching power supply circuit SW1 to halt the pump 15. This minimizes the brine leakage. A voltage signal, for example, of the maximum +12V is output to the switching power supply circuit SW2 so that an air is blown into the case 3 at the maximum power to secure the cooling in the case 3. Otherwise, if the detection sensor 51 detects a brine leakage, the operation of all electric components can be halted including the integrated circuit elements 6.

As set forth hereinabove, if the brine leaks in the connections between the outlet 13A and the inlet 13B of the pipe 13 for the heat exchanger 11, the pipes 46, 47, 48, and 23, the reserve tank 26, and pump 15 and the brine leakage in the front end within the lower portion 49 on the bottom face 3B of the case 3 is detected by the detection sensor 51, an alarm is output on the LED indicator 61. Therefore, a user can carry out maintenance rapidly against an error caused by the brine leakage. In addition, the pump 15 is halted in this condition, by which the forced brine leakage is also stopped. Furthermore, since the outlet 13A of the heat exchanger is located in the position higher than the cold plates 16 as described above, a leakage at the outlet 13A, if any, halts the pump 15, by which the brine in the heat exchanger 11 remains inside. Therefore, the brine leakage from the heat exchanger 11 is minimized.

Figure 4:
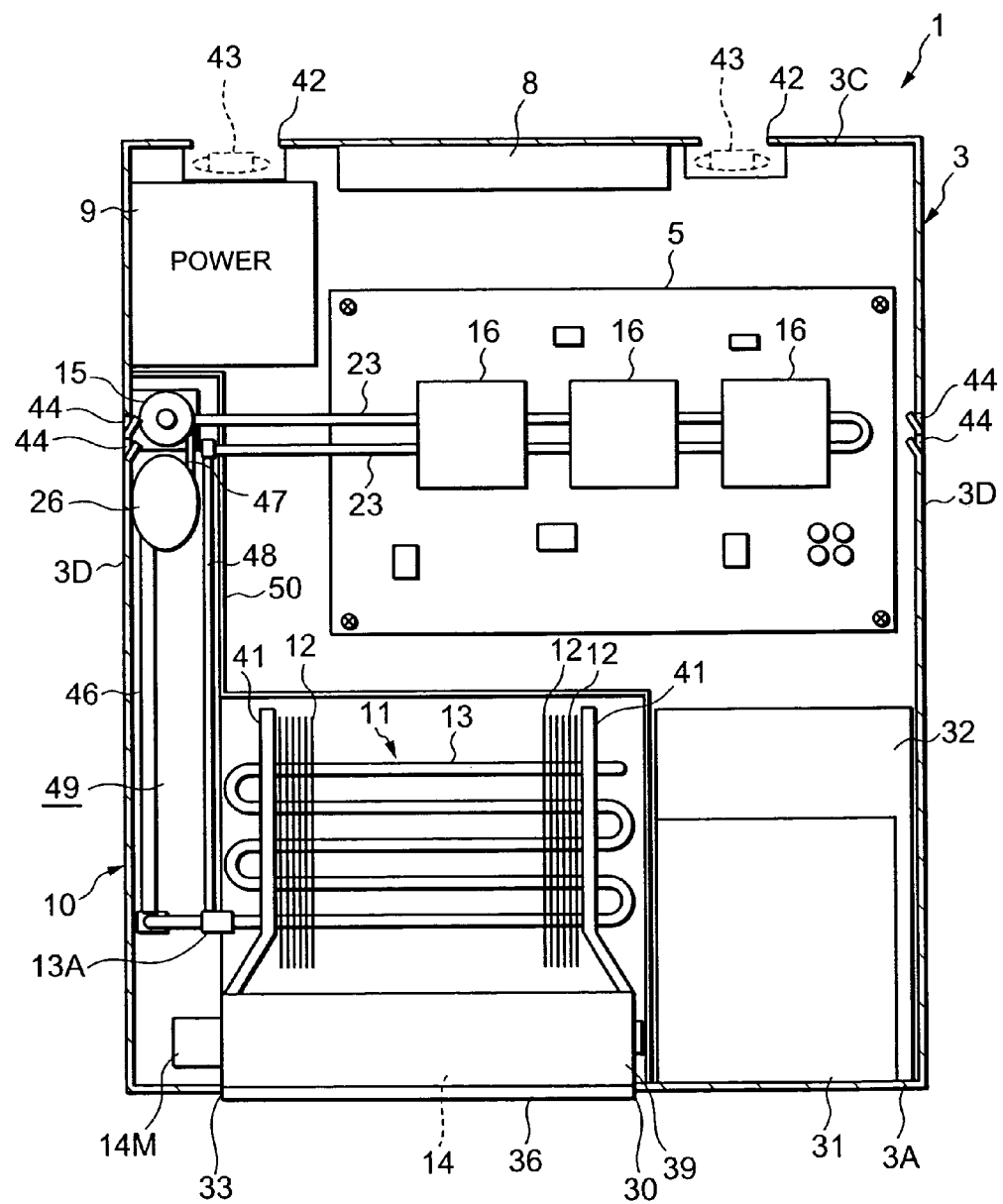
FIG. 4 is a top sectional view of the server shown in FIG. 3.
Figure 5:
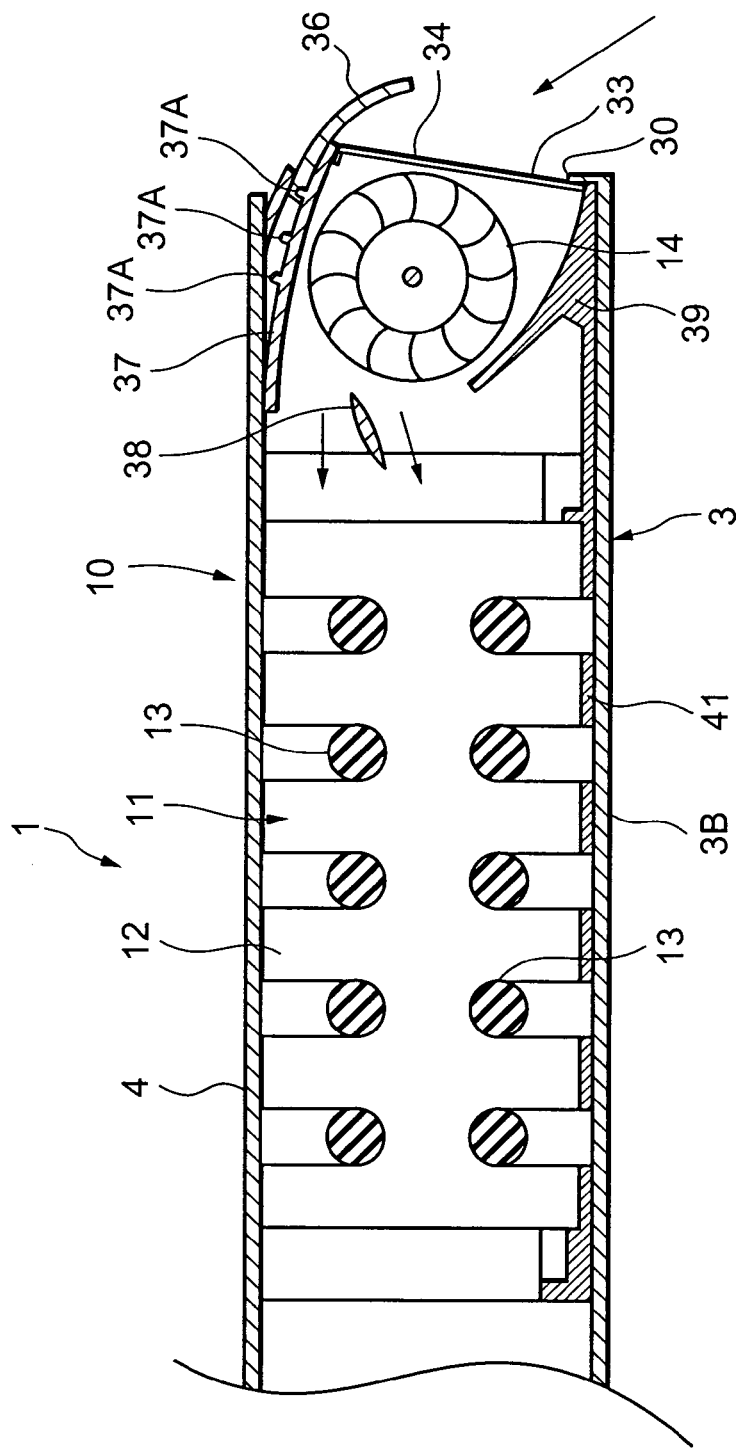
FIG. 5 is a vertical side view of a front end of the server shown in FIG. 2.
Figure 17:
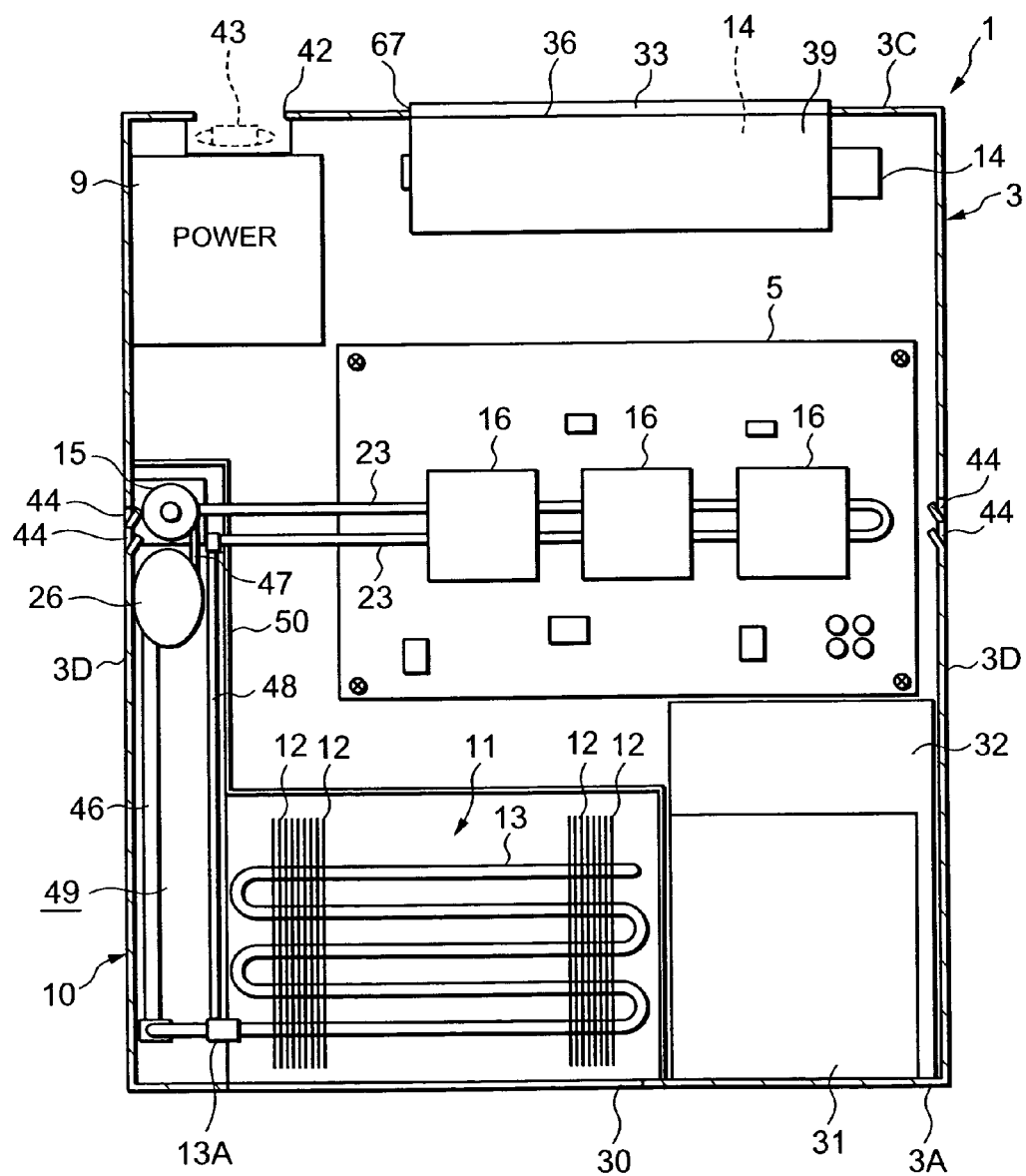
FIG. 17 is a top sectional view of a server of another embodiment of an electronic device according to the present invention.
Figure 18:
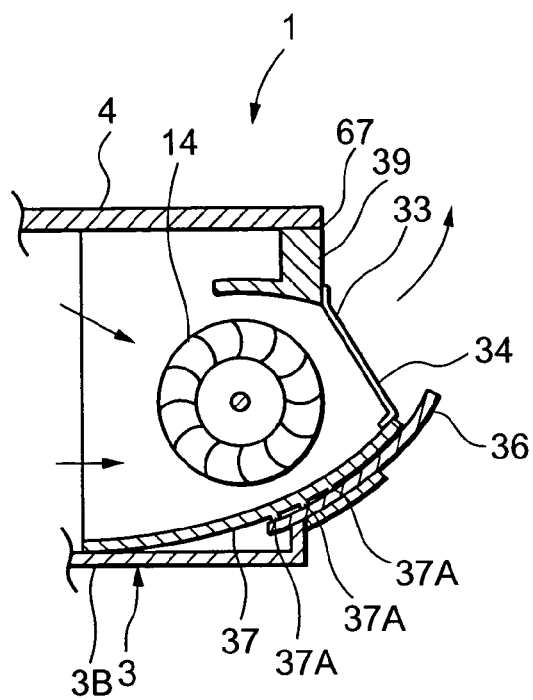
FIG. 18 is a vertical side view of a rear of the server shown in FIG. 17.

Subsequently, referring to FIGS. 17 and 18, there are shown configurations of the server 1 regarding an arrangement of the cross flow fan 14 according to another embodiment. In these diagrams, the same reference characters as in FIGS. 4 and 5 refer to corresponding parts or have like functions. In this case, an opening 67 is formed on the rear face 3C of the case 3 and a fan casing 39 of the cross flow fan 14 is arranged correspondingly on the inside of the opening 67. Accordingly, the cross flow fan 14 is provided in the vicinity of the opening 67.

The fan casing 39 in this case is for use in forming an air way from the cross flow fan 14 to the heat exchanger 11 in front thereof. The opening 33 of the fan casing 39 faces the outside with oriented upward from the opening 67 of the case 3. The filter 34 for dust exclusion as described above is attached to the opening 33.

When the cross flow fan 14 is operated, an air around the circuit board 5 in the case 3 in the front of the cross flow fan is sucked. This causes an air suction from the opening 30 on the front face 3A and the vent holes 44 on the side faces 3D and 3D described above. After the heat exchange of the heat exchanger 11, the cross flow fan 14 discharges the air to the outside from the opening 33 (opening 67). This enables the cooling of the heat exchanger 11 and the cold plates 16 of the brine cooling unit 10 for cooling the integrated circuit elements 6 in the same manner as for the above.

In this connection, a curved opening angle adjustment plate 36 is attached to the lower edge of the opening 33 of the fan casing 39. The opening angle adjustment plate 36 is free to be latched or released by ribs 37A longitudinally provided in a protruding condition at specified intervals on a latch plate 37 provided in the lower portion on the inside of the opening 33 in this case, too. By changing the positions of the ribs 37A by moving them longitudinally for latching, it becomes possible to change an amount of protrusion from the lower edge of the opening 33 in three steps. This enables changes in three steps such as, for example, 15 deg, 30 deg, and 45 deg to horizontal as an upward angle of the opening 33.

As described above, in an office where this type of server rack 2 is installed, an air-conditioning air is blown from the floor side. The plurality of servers 1 are attached to the server rack 2 as set forth in the above. The upward angle of the opening 33 is adjusted to be smaller (closer to horizontal) for the upper servers 1 and the upward angle of the opening 33 is adjusted to be larger (more upwardly oriented) for the lower servers 1. This makes it possible to discharge the air in the case 3 to the outside easily, thereby further improving the cooling efficiency of the integrated circuit elements 6.

The method of air conditioning for a place where the server rack 2 is installed is not limited to the air blowing from the floor side, but includes cases of air conditioning using a floor-type or ceiling-type air conditioner and via a duct.

Figure 19:
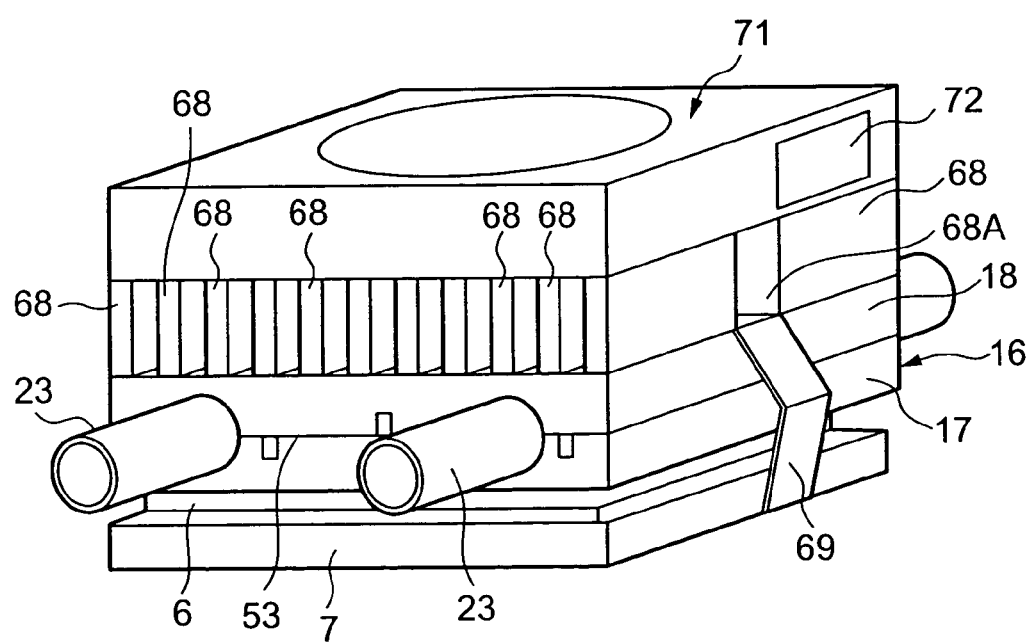
FIG. 19 is a perspective view of a cold plate and an integrated circuit element of the server of another embodiment of the electronic device according to the present invention.

Referring to FIG. 19, there is shown an example of a configuration where cooling fins 68 are mounted on the cold plate 16. In this diagram, the same reference characters as in FIGS. 9 and 10 refer to like parts. In this case, however, the integrated circuit element 6 is sandwiched between the cold plate 16 and the socket 7 and the cold plate 16 is detachably fixed to the socket 7 by means of the elastic metal leaf spring 69 as elastic material.

Furthermore, a plurality of aluminum cooling fins 68 are mounted on the upper face of the cover member 18 of the cold plate 16, in other words, to the face opposite to the lower face contacted by the integrated circuit element 6 in this case. In this condition, a notch 68A into which a leaf spring 69 can be inserted is formed in the cooling fins 68. Still further, an air blower 71 for the cold plate 16 is mounted on the upper face of the cooling fins 68. The air blower 71 comprises a centrifugal turbo fan having a small thickness. It sucks air from the side of the cooling fins 68 located downward and discharges it from the discharge opening 72 on the side face.

According to the above constitution, the cold plate 16 is powerfully cooled down by the heat dissipation from the cooling fins 68 and the forcible ventilation with the air blower 71 in addition to the cooling with the brine. Therefore, the integrated circuit element 6 can be cooled rapidly and accurately. Furthermore, since the air blower 71 is a centrifugal fan, an expansion of the height is minimized to achieve the miniaturization.

Subsequently, referring to FIG. 20, there is shown another embodiment of the mounting structure of the cold plate 16 and the integrated circuit element 6. In this diagram, the same reference characters as in FIGS. 9 and 10 refer to like parts. In this structure, however, the cold plate 16 is attached to the bottom face 3B of the case 3 and the circuit board 5 is located in the upper portion. As shown in this diagram, fitting seats 17A and 17B are provided in the left and right lower ends of the base member 17 of the cold plate 16. By threading screws 76 into screw holes provided in the fitting seats 17A and 17B, the cold plate 16 is fixed to the bottom face 3B of the case 3. The sheet material having the heat conductance as described the above is preferably put between the cold plate 16 and the bottom face 3B.

The integrated circuit element 6 is arranged so as to be contacted by the upper face of the cover member 18 of the cold plate 16 mounted on the bottom face 3B of the case 3 via a heat conductor (not shown) such as grease. Furthermore, the socket 7 electrically connected to the integrated circuit element 6 and the circuit board 5 electrically connected to the socket are mounted on the integrated circuit element 6. The circuit board 5, the socket 7, and the integrated circuit element 6 are integrally fixed to the bottom face 3B of the case 3 by fitting a pair of elastic metal leaf springs 73A and 73B as elastic material over the socket 7 and the cold plate 16 as described below. The leaf springs 73A and 73B are as shown formed by a pair of components comprising a pair of arms and angle connections for connecting the rear anchors of the arms.

Figure 20:
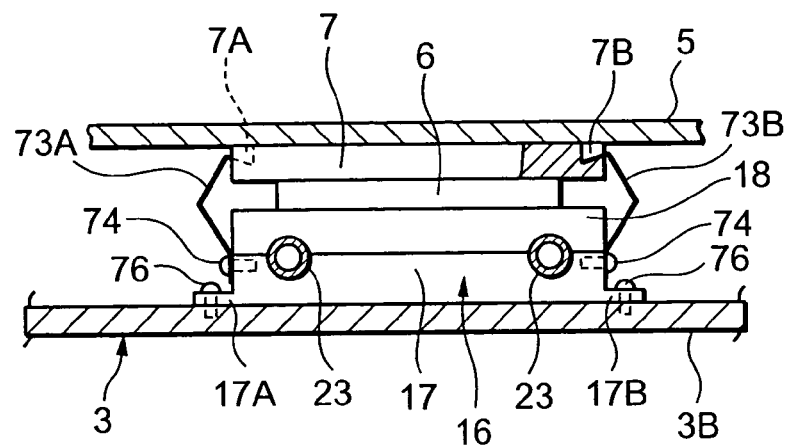
FIG. 20 is a diagram showing another mounting structure of the integrated circuit element to the cold plate in the electronic device according to the present invention.

In other words, as shown in FIG. 20, one ends of the pair of leaf springs 73A and 73B are fixed to both side walls of the base member 17 of the cold plate 16 with screws 74. The other ends of the pair of leaf springs 73A and 73B are detachably engaged with engagement grooves 7A and 7B having an angled engagement face formed on both side walls of the socket 7. Thereby, the integrated circuit element 6 is attached to the bottom face 3B of the case 3 via the cold plate 16 by means of contraction force of the leaf springs 73A and 73B.

With the fixing structure, the integrated circuit element 6 can be easily attached to the case 3 in the condition where it is sandwiched between the cold plate 16 and the socket 7. In this case, the cold plate 16 is in very close contact with the case 3 and therefore its heat conductance is high. Accordingly, the effect of heat dissipation is high, thus enabling effective cooling of the integrated circuit element 6 that is an electronic component causing a heat build-up in combination with the brine cooling action.

Figure 21:
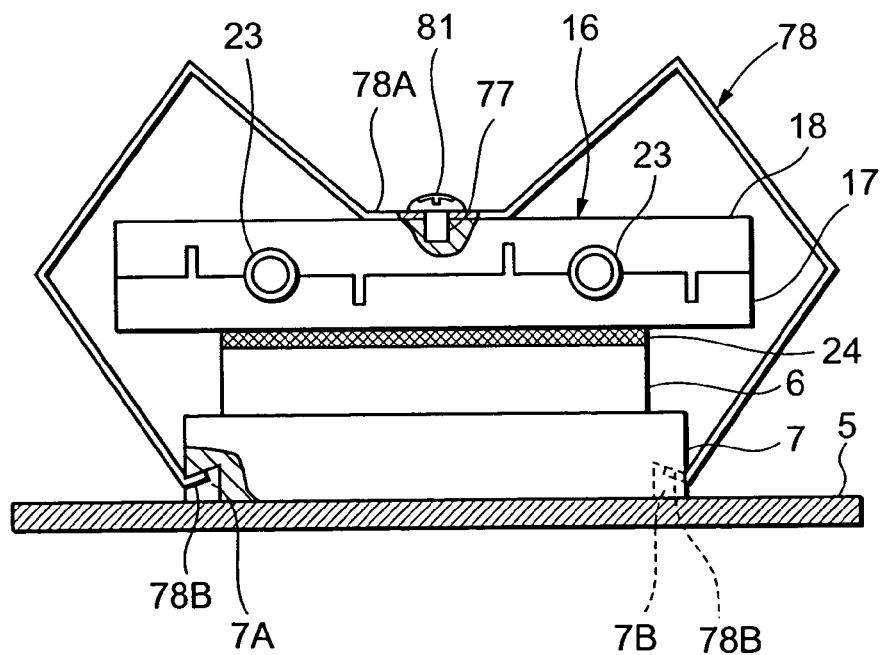
FIG. 21 is a diagram showing still another mounting structure of the integrated circuit element to the cold plate in the electronic device according to the present invention.

Referring to FIG. 21, there is shown still another embodiment of the mounting structure of the cold plate 16 and the integrated circuit element 6. In this diagram, the same reference characters as in FIGS. 9 and 10 refer to like parts. In this case, the circuit board 5 is fixed to the bottom face 3B of the case 3 in the raised condition as described in the first embodiment. The socket 7 electrically connected to the circuit board 5 is provided on the upper face of the circuit board 5. The integrated circuit element 6 is electrically connected and attached to it on the socket 7. In this case, a screw hole 77 is formed in the center of the upper face of the cover member 18 of the cold plate 16. An elastic metal leaf spring 78 as elastic material has a profile almost in M shape. A flat 78A is formed in the center of the leaf spring 78. The flat 78A is fixed to the upper face of the cover member 18 of the cold plate 16 with a screw 81 to be threaded into the screw hole 77. Furthermore, both ends 78B and 78B of the leaf spring 78 are detachably engaged in the engagement grooves 7A and 7B formed on both side walls of the socket 7. Thereby, the cold plate 16 is integrally pressed against the integrated circuit element 6 by means of the contraction force of the leaf spring 78 so as to support the integrated circuit element 6 between the cold plate 16 and the socket 7 for mounting them on the circuit board 5.

Figure 22:
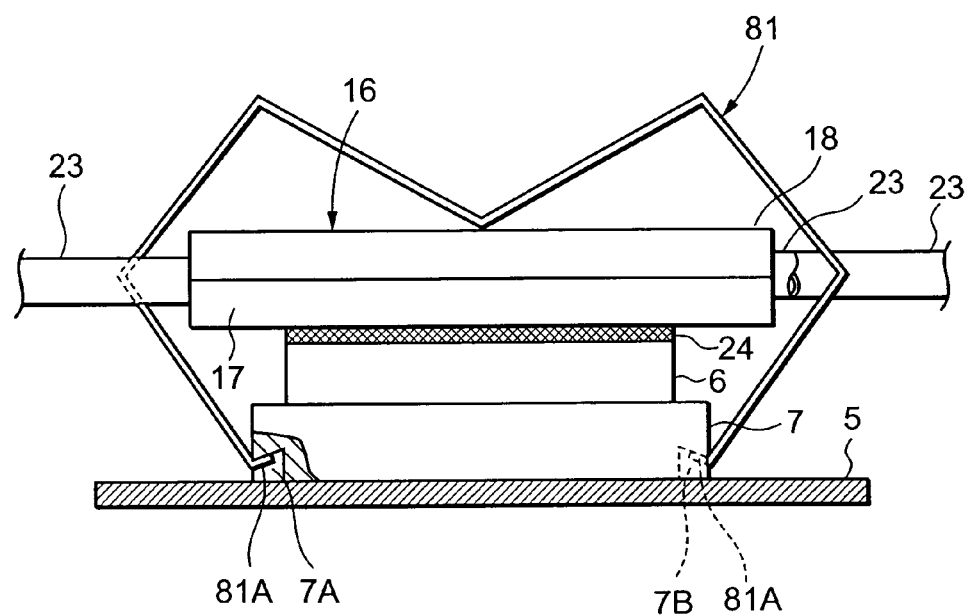
FIG. 22 is a diagram showing further another mounting structure of the integrated circuit element to the cold plate in the electronic device according to the present invention.

Referring to FIG. 22, there is shown still another embodiment of the mounting structure of the cold plate 16 and the integrated circuit element 6. In this case, the circuit board 5 is also fixed to the bottom face 3B of the case 3 in the raised condition and the socket 7 electrically connected to the circuit board 5 is provided on the upper face of the circuit board 5. The integrated circuit element 6 is electrically connected and attached to it on the socket 7.

The cold plate 16 is arranged on the upper face of the integrated circuit element 6 via the grease 24. An elastic metal leaf spring 81 has a profile almost in M shape in the same manner as for the above. Its center is put in contact with the center of the upper surface of the cover member 17 of the cold plate 16. Both sides of the leaf spring 81 are inserted into a portion between two pipes 23 and 23 so as to be engaged in a portion between them. Furthermore, both ends 81A and 81A are detachably engaged in the engagement grooves 7A and 7B formed on both side walls of the socket 7 respectively. Thereby, the cold plate 16 is integrally pressed against the integrated circuit element 6 by means of a contraction force of the leaf spring 81 so as to support the integrated circuit element 6 between the cold plate 16 and the socket 7 for mounting them on the circuit board 5. In this condition the leaf spring 81 is engaged in the portion between the pipes 23 and 23 and therefore it is not displaced without fixing with screws.

Also by using the above fixing structure, the integrated circuit element 6 can be easily mounted on the circuit board 5 in the condition where the integrated circuit element 6 is put between the cold plate 16 and the socket 7. Particularly in FIG. 22, screws for fixing the leaf spring are unnecessary.

Figure 23:
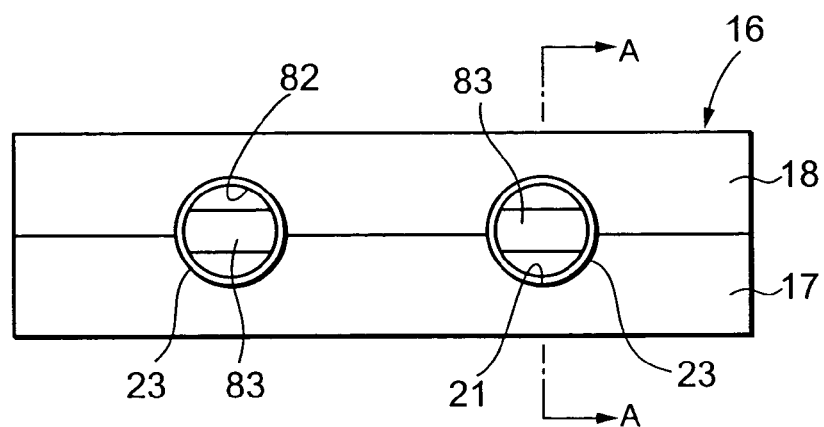
FIG. 23 is a front view showing another embodiment of the cold plate in the electronic device according to the present invention.

Subsequently, referring to FIGS. 23 and 24, there is shown another structure of the cold plate 16. In these diagrams, the same reference characters as in FIGS. 9 and 10 refer to like parts, too. In this condition, a single or a plurality of (two in this embodiment) protrusions 82 are formed in positions corresponding to the upstream of the brine flow.

According to this structure, the pipe 23 is crushed by the protrusions 82 at caulking of the base member 17 and the cover member 18, by which bottlenecks 83 are formed by the number of the protrusions 82 in positions corresponding to the upstream of the brine flow.

Figure 24:
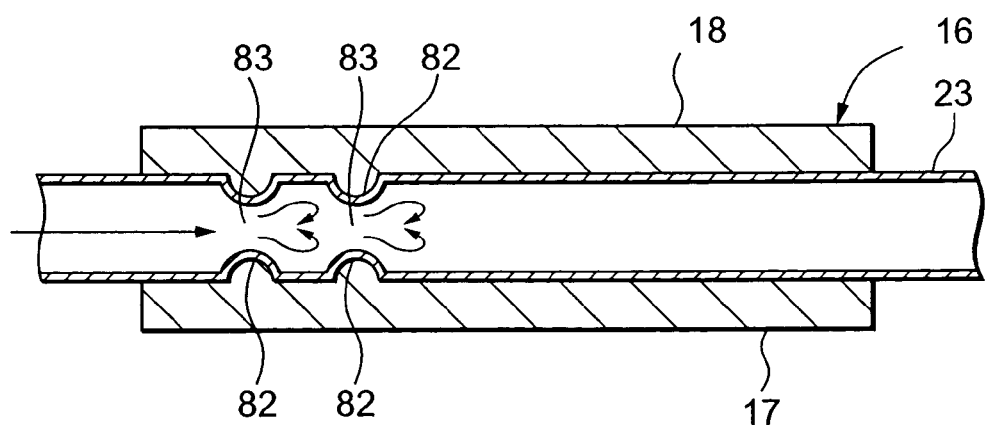
FIG. 24 is a sectional view taken along line A—A of FIG. 23.

With the formation of the bottlenecks 83 on the pipe 23, turbulent flows occur in the cold plate 16 when the brine circulating in the pipe 23 passes through the bottlenecks 83 as shown in FIG. 24 at cooling the integrated circuit element 6. As a result, the brine is agitated and brine temperature layers of peripheral and central portions of the pipe are eliminated. This improves the cooling efficiency of cooling the integrated circuit element 6.

Furthermore, the protrusions 82 are previously formed in the pipe grooves 21 on the base member 17 and the cover member 18 of the cold plate 16 and the bottlenecks 83 are formed by the protrusions 82 by crushing the pipe 23 at caulking of the members 17 and 18 for connection, and therefore the manufacturing process of the cold plate 16 is the same as the conventional one, thus bringing an increase in production costs down.

While the present invention has been described in connection with preferred embodiments with referring to numerical values, it is to be understood that these values are not limited to those specific embodiments and that the power or capacity of the integrated circuit elements is appropriately set according to a quantity or the like. In addition, while the present invention has been described in connection with preferred embodiments in which the microcomputer 54 controls the power for the operation of the pump 15 and the cross flow fan 14 on the basis of the brine return temperature and the operating ratio of the integrated circuit elements 6, the present invention is not limited to those embodiments. On the contrary, it is intended to include alternatives or modifications such that the pump 15 is regularly operated with a power control of the cross flow fan 14 only or that the cross flow fan 14 is regularly operated with a power control of the pump 15 only.

As set forth hereinabove, according to the present invention, there is provided an electronic device containing a circuit board mounted with an integrated circuit element requiring measures against heat generation in a single case, comprising: a cold plate mounted on the integrated circuit element in such a way as to enable a heat transfer from the integrated circuit element; a heat exchanger for cooling brine heated by the cold plate by circulating the brine; a fan casing forming an air way from a blower fan at an opening on a surface of the case to the heat exchanger; a reserve tank for storing the brine and a pump for circulating the brine, which are provided in order in a brine flow from the heat exchanger to the cold plate; and a linear brine passage formed in the cold plate and having at least one pair of back and forth channels. Therefore, the brine cooled by the heat exchanger effectively cools down the integrated circuit element through the cold plate.

This enables reliable or effective elimination of disadvantages such that the integrated circuit element such as a CPU or an LSI falls into an unstable operation or a thermal damage due to a high temperature.

According to the present invention, with these features, the electronic device has a control unit for controlling at least one of the blower fan and the pump in such a way as to maintain a temperature of the cold plate at +70° C. or lower when a temperature of a portion around the periphery of the case is at +35° C. or higher, thereby enabling a rapid increase of the cooling capacity against a sudden heat generation of the integrated circuit elements 6 so as to prevent an occurrence of a damage on the integrated circuit elements.

Furthermore, according to the present invention, with the above features, a plurality of the integrated circuit elements are mounted on the circuit board and the cold plate is provided for each of the integrated circuit elements, thereby enabling effective cooling of each of the plurality of integrated circuit elements. In this case, it is possible to minimize a temperature difference between the cold plates in the side of the upstream and of the downstream of the brine flow, thus enabling equal cooling of the integrated circuit elements provided in such a way as to enable the heat transfer to the plurality of cold plates. Particularly, the passage in the cold plates is linear, thereby simplifying the piping structure and reducing the brine circulation resistance, by which the integrated circuit elements can be cooled efficiently.

Still further, according to the present invention, with the above features, heat conductive material is provided between the integrated circuit element and the cold plate, and the integrated circuit element is put between the cold plate and a socket holding the integrated circuit element by using elastic material, thereby enabling very simple mounting of the integrated circuit element and the cold plate.

According to the present invention, with the above features, the blower fan is a cross flow fan, which is provided in the vicinity of the opening of the case and supplies an air taken from the opening linearly along a long side of the heat exchanger, thereby enabling efficient blowing of the air taken into the case from the opening by the cross flow fan over the entire surface of the long side of the heat exchanger and thus improving the heat exchange efficiency in the heat exchanger.

This improves the heat exchange efficiency between the brine flow and the ventilation air in the heat exchanger, thus improving the brine cooling efficiency of the integrated circuit elements and enabling rapid and efficient cooling of the integrated circuit elements.

According to the present invention, with the above features, the fan casing is configured in such a way as to take in an air from below with its opening facing downward, by which an outside air (or cold air) can be taken into the case from under the opening of the case. Particularly, if a specific device is used to supply an air (or cold air) from under the case, the air can be easily taken into the case, thus further improving the cooling efficiency of the integrated circuit elements.

Furthermore, according to the present invention, with the above features, the blower fan is a cross flow fan, which is provided in the vicinity of the opening of the case and discharges an air heated by the heat exchanger from the opening, thus enabling efficient discharging of the air heated by the heat exchanger in the case.

This improves the heat exchange in the heat exchanger and the cooling efficiency of the integrated circuit elements, thus enabling rapid and efficient cooling of the integrated circuit elements.

Still further, according to the present invention, with the above features, the fan casing is configured in such a way as to discharge an air to the above with its opening facing upward, by which the air heated in the case and having a high temperature can be efficiently dissipated to the outside. Particularly, if a specific device is used to supply an air from under the case, the air in the case can be easily discharged to the outside, thus further improving the cooling efficiency of the integrated circuit elements.

According to the present invention, with the above features, an angle of the opening of the fan casing is adjustable. Therefore, for example, even if the electronic devices are positioned one on top of another in a stacked relationship in a plurality of stages, smooth air circulation is achieved in the cases of the respective electronic devices by adjusting the angle of the opening of the fan casing in each stage.

According to the present invention, with the above features, the cold plate comprises two pieces of heat conductive material laminated to each other with a concavity and a convexity formed thereon engaged with each other so as to sandwich a pipe through which the brine flows between them, thereby simplifying the structure of the cold plate and the assembling workability and improving the productivity.

Furthermore, according to the present invention, with the above features, there is heat conductance between the heat conductive material and the pipe and sheet material having elasticity is sandwiched therebetween, thereby improving the heat conductivity between the heat conductive material and the pipe by means of the sheet material. This improves the heat exchange efficiency between the brine flowing through the pipe and the heat conductive material having the integrated circuit element, thus further improving the cooling efficiency of the integrated circuit element.

Still further, according to the present invention, with the above features, bottlenecks are provided in positions corresponding to the upstream of the brine flow within the pipe put between two pieces of the heat conductive material. Thereby, turbulent flows occur when the brine circulating in the pipe 23 passes through the bottlenecks. As a result, the brine is agitated and brine temperature layers of peripheral and central portions of the pipe are eliminated, thus improving the cooling efficiency of cooling the integrated circuit element.

According to the present invention, with the above features, the heat exchanger comprises a plurality of plates having heat conductance and a pipe through which the brine flows with penetrating the plates in such a way as to enable a heat transfer, wherein a part of a casing covering the heat exchanger is formed by the fan casing or an extension thereof, and wherein the fan casing has a shape causing the air to be collected on the plates of the heat exchanger. Thereby, the air taken into the case by the cross flow fan can be guided only to the heat exchanger by means of the fan casing or its extension partially forming the casing covering the heat exchanger.

It is effective to eliminate a disadvantage such that the heat exchange efficiency is decreased by a leakage of the air taken into the casing by the cross flow fan into a portion other than a portion between the plates forming the heat exchanger. It improves the efficiency of the heat exchange with the brine flow in the heat exchange and improves the cooling efficiency of the integrated circuit element with the brine, thus enabling rapid and accurate cooling.

Furthermore, according to the present invention, with the above features, a plurality of vent holes are provided in the position opposed to the circuit board on a surface of the case enclosing the circuit board. Thereby, after the heating of the air taken into the case by the blower fan from the opening by the heat exchange with the heat exchanger, a fresh air can be further taken into the case from the vent holes, thus preventing a disadvantage such as a significant temperature rise in the case caused by the air after the heat exchange with the heat exchanger.

Still further, according to the present invention, with the above features, the vent holes are formed by cutting and raising a part of the case. Thereby, the vent holes can be easily formed, thus improving the productivity.

According to the present invention, with the above features, a line forming a circulation path of the brine circulating between the cold plate and the heat exchanger is arranged in one side portion within the case and a bottom face of the side portion is formed lower than the heat exchanger. Thereby, if a brine leakage occurs due to a poor connection or any crack or damage on the line forming the circulation path of the brine, the leaked brine stands on the lower bottom face in the side portion. It is effective to prevent a disadvantage such as an adverse effect of short-circuit or the like on the integrated circuit element arranged within the case caused by the brine leakage.

According to the present invention, with the above features, the reserve tank and the pump are arranged in the side portion within the case. Thereby, if any failure occurs in the reserve tank or the pump, the brine that has leaked from the reserve tank or the pump stands on the lower bottom face in the side portion. Thus, it is effective to prevent an adverse effect on the integrated circuit elements, which may be caused by the brine leakage into the entire area within the case.

According to the present invention, with the above features, the bottom face of the side portion within the case slopes downwardly in a predetermined direction. Thereby, the brine that has leaked into the side portion within the case is caused to stream down in a predetermined direction so as to be collected, thus enabling a delay of the occurrence of an effect on other devices mounted within the case.

Furthermore, according to the present invention, with the above features, a brine detection sensor is provided in the lowest position of the bottom face within the case or in the vicinity thereof and a detection unit is provided for outputting an alarm in response to an output from the brine detection sensor. Thereby, if a brine leakage occurs, the brine detection sensor detects it immediately and an alarm can be output in response to the output from the detection sensor. Therefore, a user can be quickly informed of the occurrence of the abnormal condition.

It is effective to minimize the expansion of the damage caused by the brine leakage, thus preventing an adverse effect on the integrated circuit element mounted within the case.

Still further, according to the present invention, with the above features, a plurality of cooling fins are provided in the side opposed to the integrated circuit element on the cold plate. Thereby, the heat generated by the integrated circuit element of the cold plate can be cooled down by the cooling fins in addition to the cooling with the brine, thus enabling rapid and accurate cooling of the integrated circuit element.

According to the present invention, with the above features, an air blower for the cold plate is mounted on the cooling fins. Thereby, the cooling fins can be forcibly cooled down by the air blower for the cold plate, thus enabling more rapid and accurate cooling of the integrated circuit element.

According to the present invention, with the above features, the air blower for the cold plate has a centrifugal fan. Thereby, the cold plate can be forcibly cooled down by using the fan of relatively low profile, thus achieving a miniaturization of the device.

Furthermore, according to the present invention, with the above features, the heat exchanger comprises a plurality of plates having heat conductance and a pipe through which the brine flows with penetrating the plates in such a way as to enable a heat transfer, wherein an outlet from the heat exchanger for the brine flowing from the pipe to the cold plate is provided in a position higher than the cold plate. Thereby, if a poor connection or any crack or damage occurs in the outlet from the heat exchanger, the brine leakage from the heat exchanger can be minimized. It is effective to minimize an adverse effect on the integrated circuit element mounted within the case.

What is claimed is:

1. An electronic device containing a circuit board mounted with an integrated circuit element requiring measures against heat generation in a single space within a case, comprising:
    a cold plate mounted on the integrated circuit element in such a way as to enable a heat transfer from said integrated circuit element;
    a heat exchanger for cooling brine heated by the cold plate by circulating the brine;
    a fan casing, which is provided in the vicinity of an opening on a surface of said case, forming an air way for guiding the air sucked from the opening from a cross flow fan to said heat exchanger provided in the space;
    a reserve tank for storing the brine and a pump for circulating the brine, which are provided in order in a brine flow from said heat exchanger to said cold plate; and
    a linear brine passage formed in said cold plate and having at least one pair of back and forth channels.

2. An electronic device containing a circuit board mounted with an integrated circuit element requiring measures against heat generation in a single space within a case, comprising:

a cold plate mounted on the integrated circuit element in such a way as to enable a heat transfer from said integrated circuit element;

a heat exchanger for cooling brine heated by the cold plate by circulating the brine;

a fan casing, which is provided in the vicinity of an opening on a surface of said case, connecting said heat exchanger with a cross flow fan for discharging the air in said space from said opening to the outside of said case via said heat exchanger;

a reserve tank for storing said brine and a pump for circulating said brine, which are provided in order in a brine flow from said heat exchanger to said cold plate; and a linear brine passage formed in said cold plate and having at least one pair of back and forth channels.

3. The electronic device according to claim 1, further comprising a control unit for controlling at least one of said cross flow fan and said pump in such a way as to maintain a temperature of said cold plate at +70° C. or lower when a temperature of a periphery of said case is at +35° C. or higher.

4. The electronic device according to claim 2, further comprising a control unit for controlling at least one of said cross flow fan and said pump in such a way as to maintain a temperature of said cold plate at +70° C. or lower when a temperature of a periphery of said case is at +35° C. or higher.

5. The electronic device according to claim 1, 2, 3, or 4, wherein a plurality of said integrated circuit elements are mounted on said circuit board and said cold plate is provided for each of said integrated circuit elements.

6. The electronic device according to claim 3 or 4, wherein heat conductive material is provided between said integrated circuit element and said cold plate and wherein said integrated circuit element is sandwiched between said cold plate and a socket holding the integrated circuit element by using elastic material.

7. The electronic device according to claim 1 or 3, wherein said fan casing is configured in such a way as to take in an air from below with its opening facing downward.

8. The electronic device according to claim 2 or 4, wherein said fan casing is configured in such a way as to discharge an air to above with its opening facing upward.

9. The electronic device according to claim 7, wherein an angle of the opening of said fan casing is adjustable.

10. The electronic device according to claim 1 or 2, wherein said heat exchanger comprises a plurality of plates having heat conductance and through which the brine flows with penetrating the plates in such a way as to enable a heat transfer, wherein a part of the casing covering the heat exchanger is formed by said fan casing or an extension thereof, and wherein said fan casing has a shape causing the air to be collected on the plates of said heat exchanger.

11. An electronic device containing a circuit board mounted with an integrated circuit element requiring measures against heat generation in a single case, comprising:

a cold plate mounted on the integrated circuit element in such a way as to enable a heat transfer from said integrated circuit element;

a heat exchanger for cooling brine heated by the cold plate by circulating the brine;

a fan casing forming an air way from a blower fan provided in the vicinity of an opening on a surface of said case to said heat exchanger;

a reserve tank for storing the brine and a pump for circulating the brine, which are provided in order in a brine flow from said heat exchanger to said cold plate; and a linear brine passage formed in said cold plate and having at least one pair of back and forth channels, wherein said cold plate comprises two pieces of heat conductive material laminated to each other with a concavity and a convexity formed thereon engaged with each other so as to sandwich a pipe through which the brine flows between them; and wherein there is heat conductance between said heat conductive material and said pipe and sheet material having elasticity is sandwiched therebetween.

12. The electronic device according to claim 11, wherein bottlenecks are provided in positions corresponding to the upstream of the brine flow within the pipe put between two pieces of said heat conductive material.

13. An electronic device containing a circuit board mounted with an integrated circuit element requiring measures against heat generation in a single case, comprising:

a cold plate mounted on the integrated circuit element in such a way as to enable a heat transfer from said integrated circuit element;

a heat exchanger for cooling brine heated by the cold plate by circulating the brine;

a fan casing forming an air way from a blower fan provided in the vicinity of an opening on a surface of said case to said heat exchanger;

a reserve tank for storing the brine and a pump for circulating the brine, which are provided in order in a brine flow from said heat exchanger to said cold plate; and a linear brine passage formed in said cold plate and having at least one pair of back and forth channels, wherein a plurality, of vent holes formed by cutting and raising a part of said case are provided in the position opposed to the circuit board on a surface of said case enclosing said circuit board.

14. An electronic device containing a circuit board mounted with an integrated circuit element requiring measures against heat generation in a single case, comprising:

a cold plate mounted on the integrated circuit element in such a way as to enable a heat transfer from said integrated circuit element;

a heat exchanger for cooling brine heated by the cold plate by circulating the brine;

a fan casing forming an air way from a blower fan provided at an opening on a surface of said case to said heat exchanger;

a reserve tank for storing the brine and a pump for circulating the brine, which are provided in order in a brine flow from said heat exchanger to said cold plate; and a linear brine passage formed in said cold plate and having at least one pair of back and forth channels, wherein a line forming a circulation path of the brine circulating between said cold plate and said heat exchanger is arranged in one side portion within said case and a bottom face of the side portion is formed lower than the heat exchanger.

15. The electronic device according to claim 14, wherein said reserve tank and said pump are arranged in the side portion within said case.

16. The electronic device according to claim 15, wherein said bottom face of the side portion within said case slopes downwardly in a predetermined direction.

17. The electronic device according to claim 16, wherein a brine detection sensor is provided in the lowest position of the bottom face within said case or in the vicinity thereof and a detection unit is provided for outputting an alarm in response to an output from the brine detection sensor.

18. The electronic device according to claim 15, 16, or 17, wherein said heat exchanger comprises a plurality of plates having heat conductance and a pipe through which the brine flows with penetrating the plates in such a way as to enable a heat transfer, wherein an outlet from said heat exchanger for the brine flowing from the pipe to said cold plate is provided in a position higher than said cold plate.

19. An electronic device containing a circuit board mounted with an integrated circuit element requiring measures against heat generation in a single case, comprising:
- a cold plate mounted on the integrated circuit element in such a way as to enable a heat transfer from said integrated circuit element;
- a heat exchanger for cooling brine heated by the cold plate by circulating the brine;
- a fan casing forming an air way from a blower fan provided at an opening on a surface of said case to said heat exchanger;
- a reserve tank for storing the brine and a pump for circulating the brine, which are provided in order in a brine flow from said heat exchanger to said cold plate; and
- a linear brine passage formed in said cold plate and having at least one pair of back and forth channels,
- wherein a plurality of cooling fins mounted with an air blower for the cold plate are provided in the side opposed to said integrated circuit element on said cold plate.

20. The electronic device according to claim 19, wherein said air blower for the cold plate has a centrifugal fan.

21. The electronic device according to claim 12, 13, 17, or 20, further comprising a control unit for controlling at least one of said blower fan and said pump in such a way as to maintain a temperature of said cold plate at +70° C. or lower when a temperature of a periphery of said case is at +35° C. or higher.

22. The electronic device according to claim 5, wherein heat conductive material is provided between said integrated circuit element and said cold plate and wherein said integrated circuit element is sandwiched between said cold plate and a socket holding the integrated circuit element by using elastic material.

23. The electronic device according to claim 8, wherein an angle of the opening of said fan casing is adjustable.

24. The electronic device according to claim 7, wherein said heat exchanger comprises a plurality of plates having heat conductance and a pipe through which the brine flows with penetrating the plates in such a way as to enable a heat transfer, wherein a part of the casing covering the heat exchanger is formed by said fan casing or an extension thereof, and wherein said fan casing has a shape causing the air to be collected on the plates of said heat exchanger.

25. The electronic device according to claim 18, further comprising a control unit for controlling at least one of said blower fan and said pump in such a way as to maintain a temperature of said cold plate at +70° C. or lower when a temperature of a periphery of said case is at +35° C. or higher.

* * * * *